US012660208B2

(12) United States Patent
Migita

(10) Patent No.: US 12,660,208 B2
(45) Date of Patent: Jun. 16, 2026

(54) STORAGE WAFER AND MANUFACTURING METHOD OF STORAGE WAFER

(71) Applicant: Kioxia Corporation, Tokyo (JP)

(72) Inventor: Tatsuo Migita, Nagoya Aichi (JP)

(73) Assignee: Kioxia Corporation, Tokyo (JP)

( * ) Notice: Subject to any disclaimer, the term of this patent is extended or adjusted under 35 U.S.C. 154(b) by 645 days.

(21) Appl. No.: 18/173,545

(22) Filed: Feb. 23, 2023

(65) Prior Publication Data

US 2023/0200092 A1 Jun. 22, 2023

Related U.S. Application Data

(63) Continuation of application No. PCT/JP2020/032164, filed on Aug. 26, 2020.

(51) Int. Cl.
*H10B 80/00* (2026.01)
*H10W 90/00* (2026.01)

(52) U.S. Cl.
CPC ........... *H10B 80/00* (2023.02); *H10W 90/732* (2026.01)

(58) Field of Classification Search
CPC ......... H10B 80/00; H10B 43/27; H01L 24/32; H01L 2224/32145; H01L 24/73; H01L 24/92; H01L 24/83; H01L 24/29; H01L 21/02; H01L 24/94; G11C 29/00
See application file for complete search history.

(56) References Cited

U.S. PATENT DOCUMENTS

| | | | |
|---|---|---|---|
| 4,489,397 A | 12/1984 | Lee | |
| 6,228,684 B1 | 5/2001 | Maruyama | |
| 6,740,981 B2 | 5/2004 | Hosomi | |
| 10,332,860 B2 | 6/2019 | Fricker et al. | |
| 2010/0085825 A1 | 4/2010 | Keeth et al. | |
| 2011/0147911 A1* | 6/2011 | Kohl ...................... H01L 24/96 | |
| | | | 438/109 |
| 2012/0091211 A1 | 4/2012 | Kuroda | |
| 2012/0315710 A1 | 12/2012 | Hozawa et al. | |
| 2014/0181376 A1 | 6/2014 | Miyamoto et al. | |
| 2019/0172820 A1 | 6/2019 | Meyers et al. | |

FOREIGN PATENT DOCUMENTS

| | | |
|---|---|---|
| CN | 102177552 A | 9/2011 |
| JP | S5752151 A | 3/1982 |
| JP | S6143435 A | 3/1986 |
| JP | S6428863 A | 1/1989 |
| JP | 2002-110803 A | 4/2002 |
| JP | 3980807 B2 | 9/2007 |
| JP | 2010-287113 A | 12/2010 |
| KR | 20070018713 A | 2/2007 |
| KR | 20140078283 A | 6/2014 |
| TW | M516221 U | 1/2016 |

* cited by examiner

*Primary Examiner* — Elias Ullah
(74) *Attorney, Agent, or Firm* — Foley & Lardner LLP

(57) ABSTRACT

A storage wafer includes: a first semiconductor; a first element layer provided on the first semiconductor; a first pad provided on a first region of the first element layer; a second pad provided on a second region of the first element layer; an adhesive film provided on the second region; a second semiconductor provided on the adhesive film; a second element layer provided on the second semiconductor; and a third pad provided on the second element layer. The first element layer includes: first and second memory chip units coupled to the first and second pads, respectively. The second element layer includes an element coupled to the third pad and isolated from both the first and second pad.

17 Claims, 24 Drawing Sheets

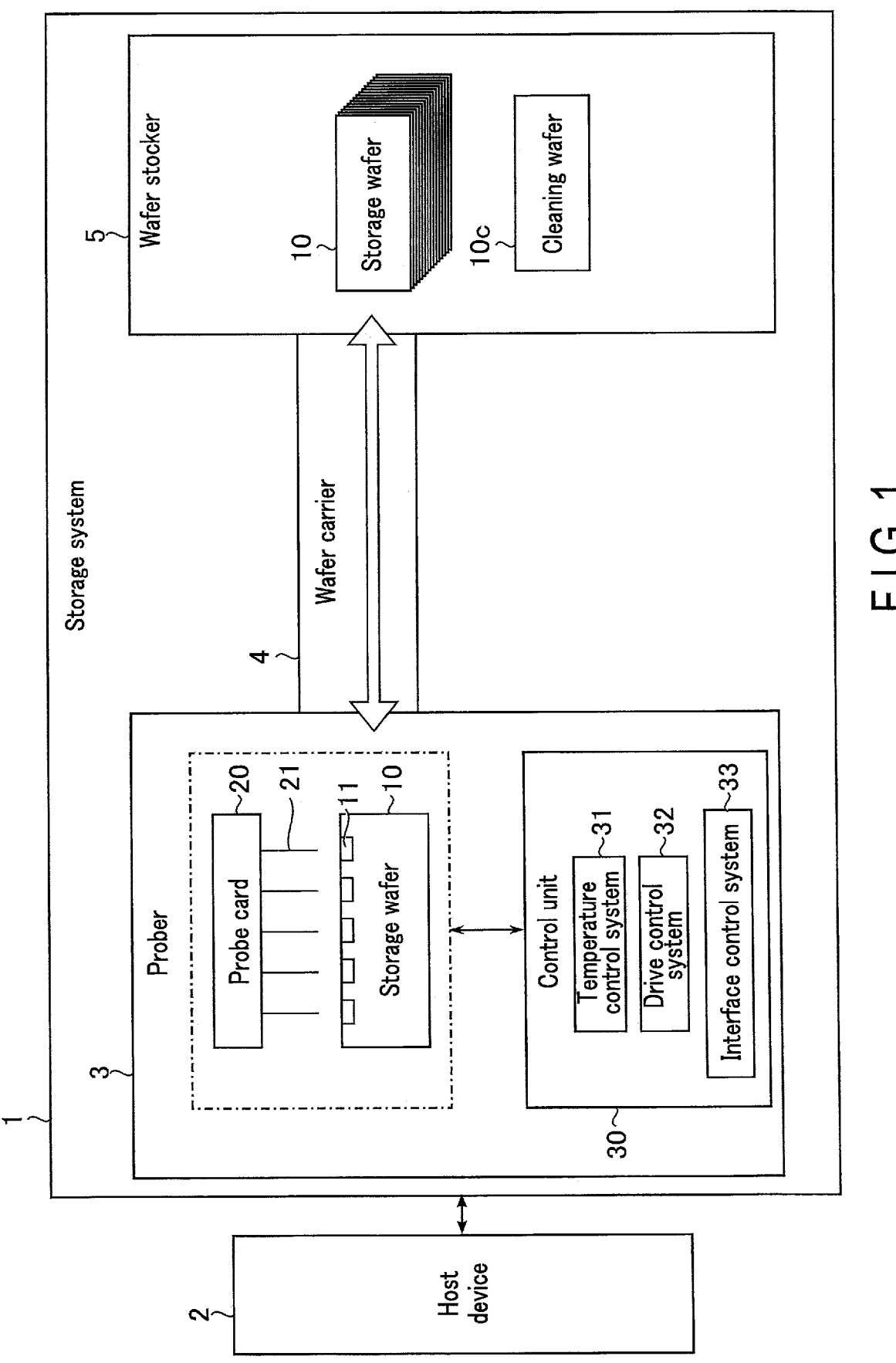
F I G. 1

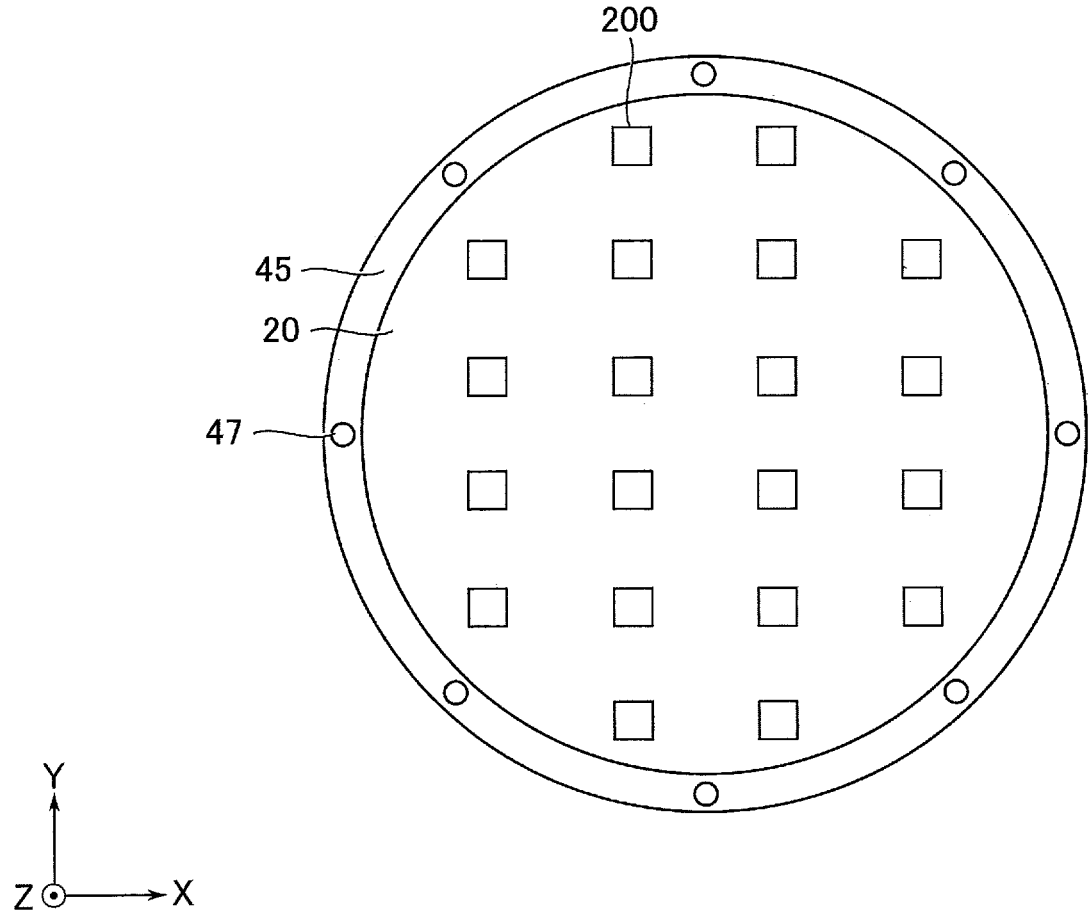
F I G. 3

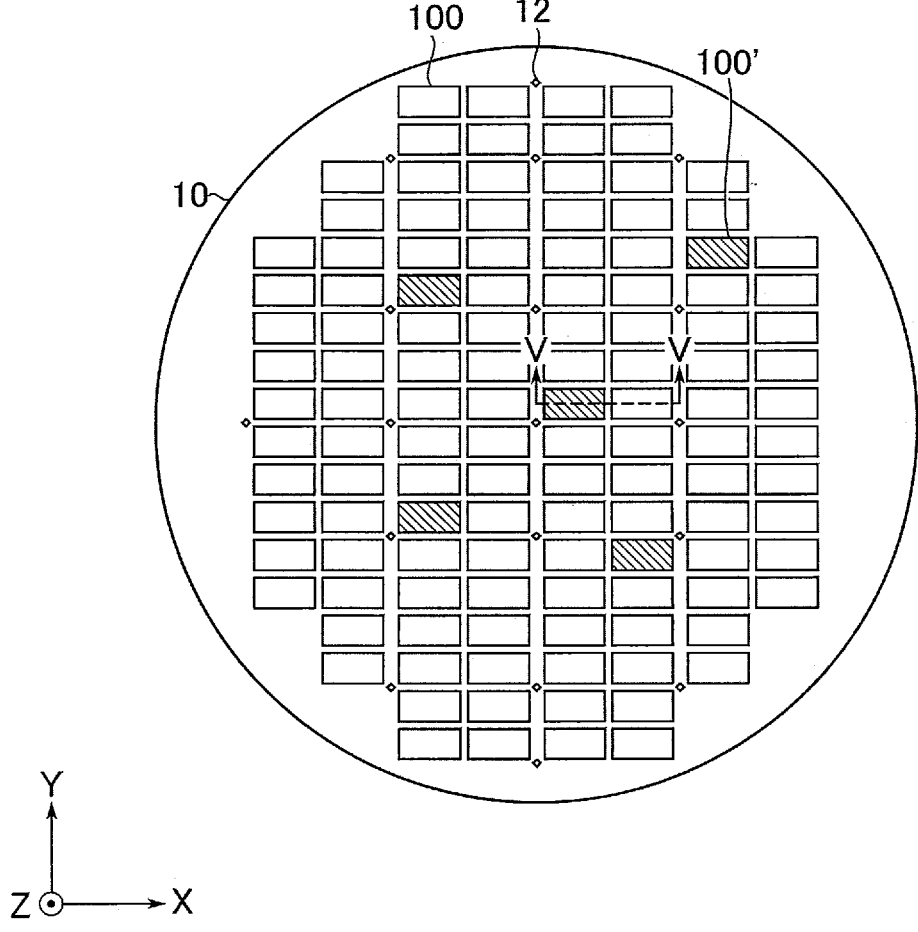
F I G. 4

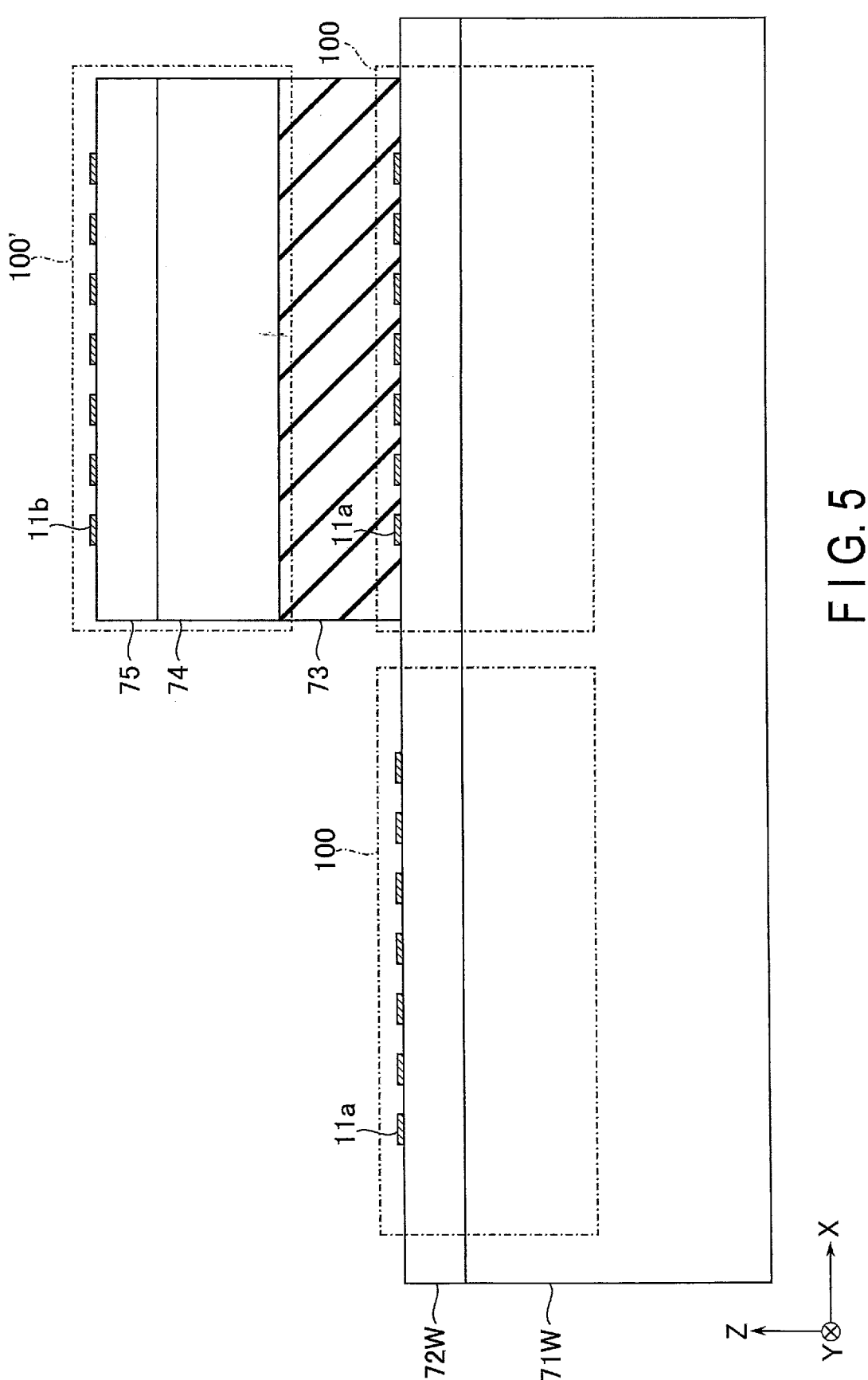
F I G. 5

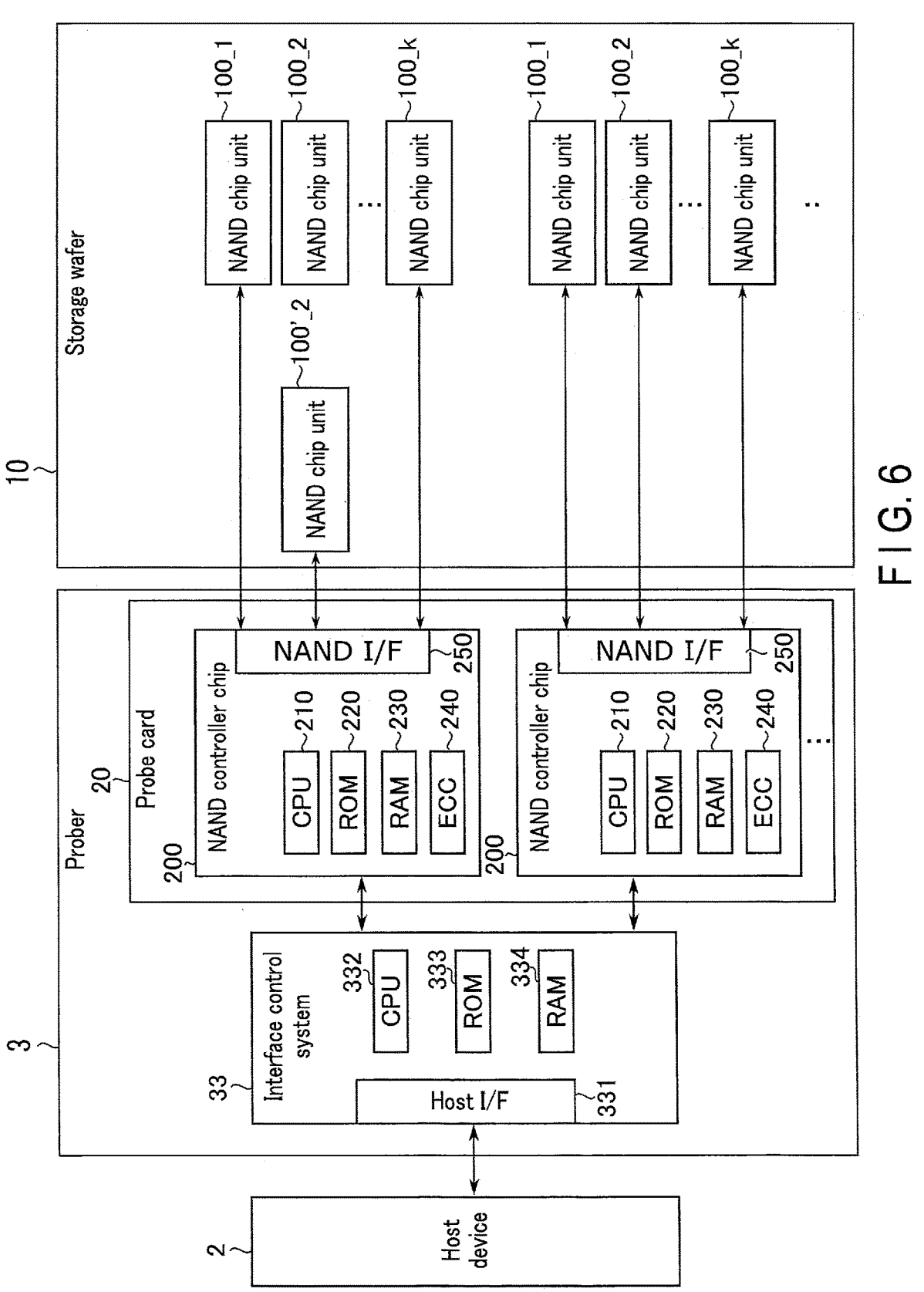
F I G. 6

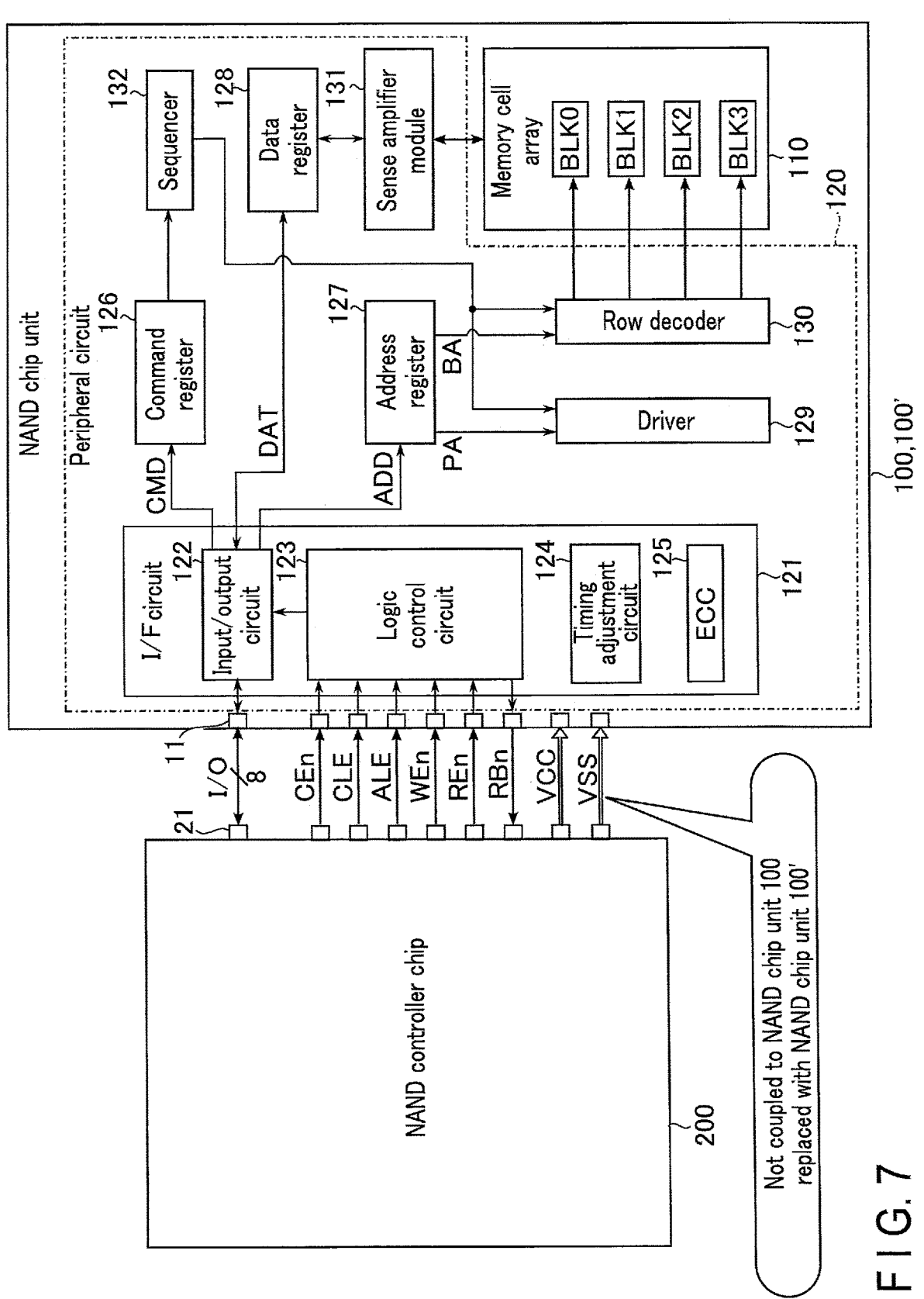
Not coupled to NAND chip unit 100
replaced with NAND chip unit 100'
F I G. 7

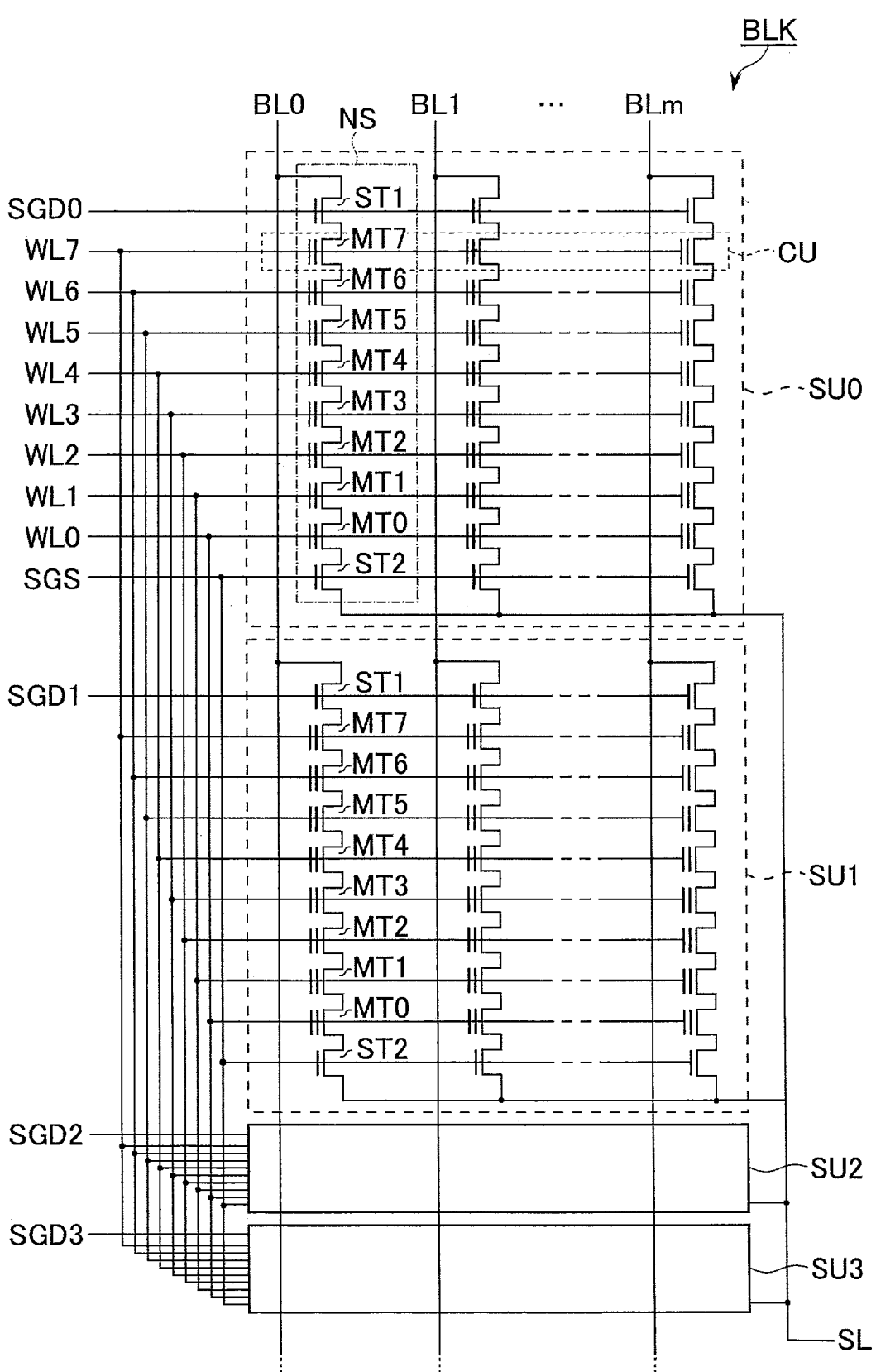
F I G. 8

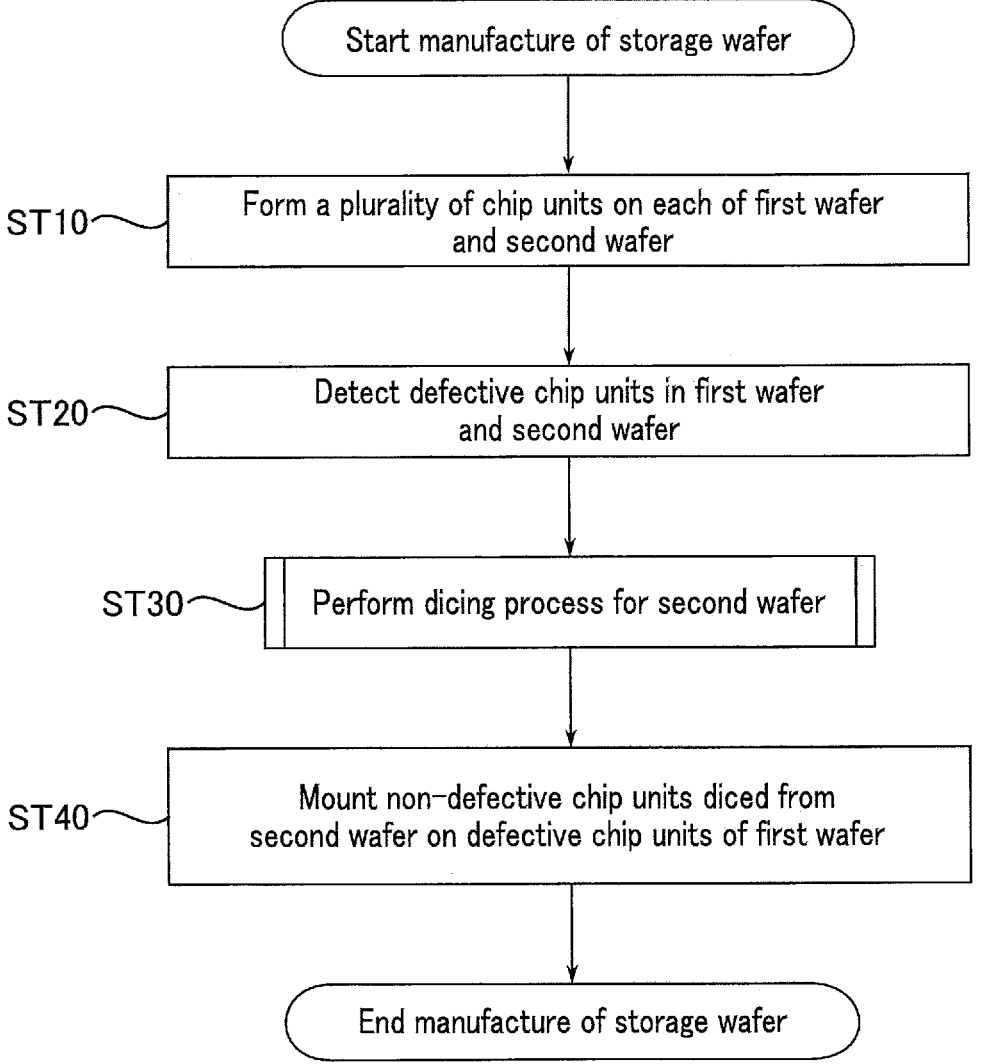
ST10 — Form a plurality of chip units on each of first wafer and second wafer
ST20 — Detect defective chip units in first wafer and second wafer
ST30 — Perform dicing process for second wafer
ST40 — Mount non-defective chip units diced from second wafer on defective chip units of first wafer
F I G. 10

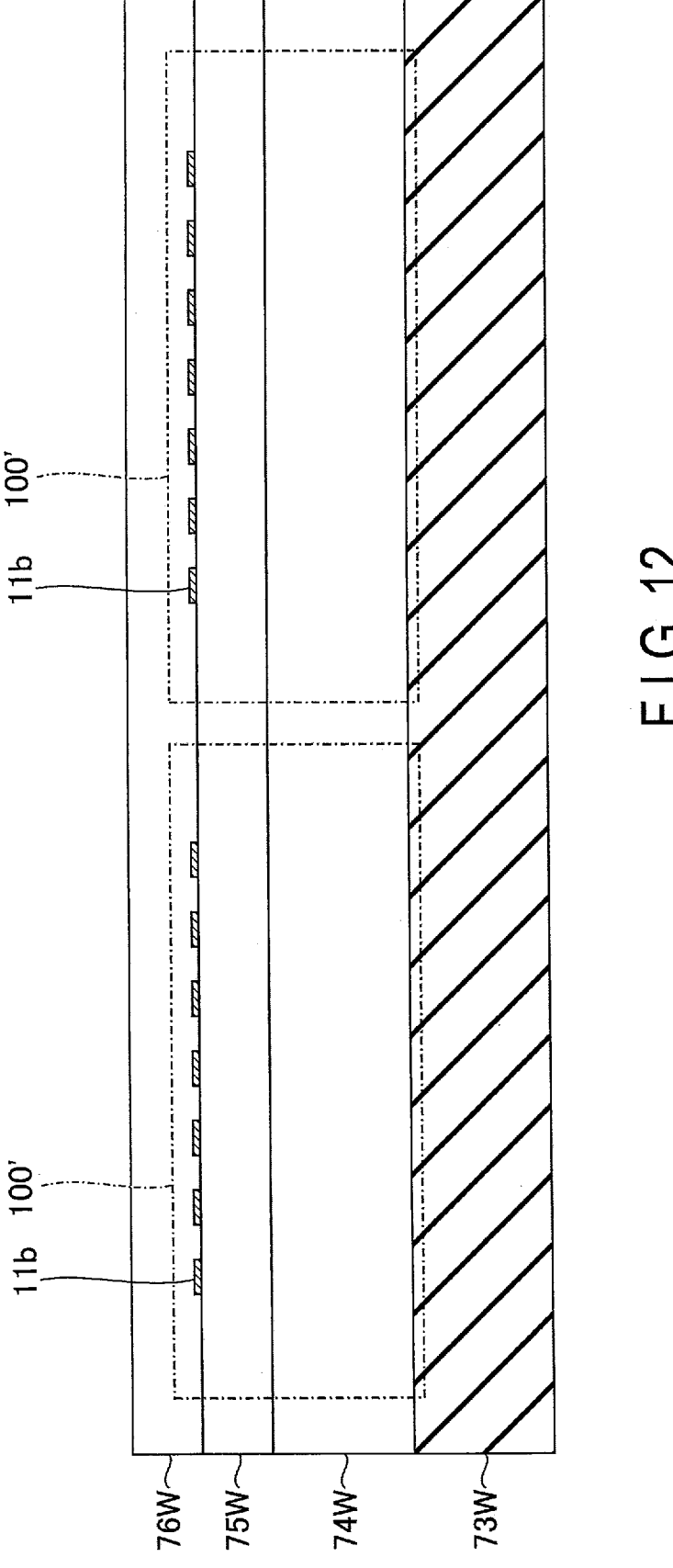
F I G. 12

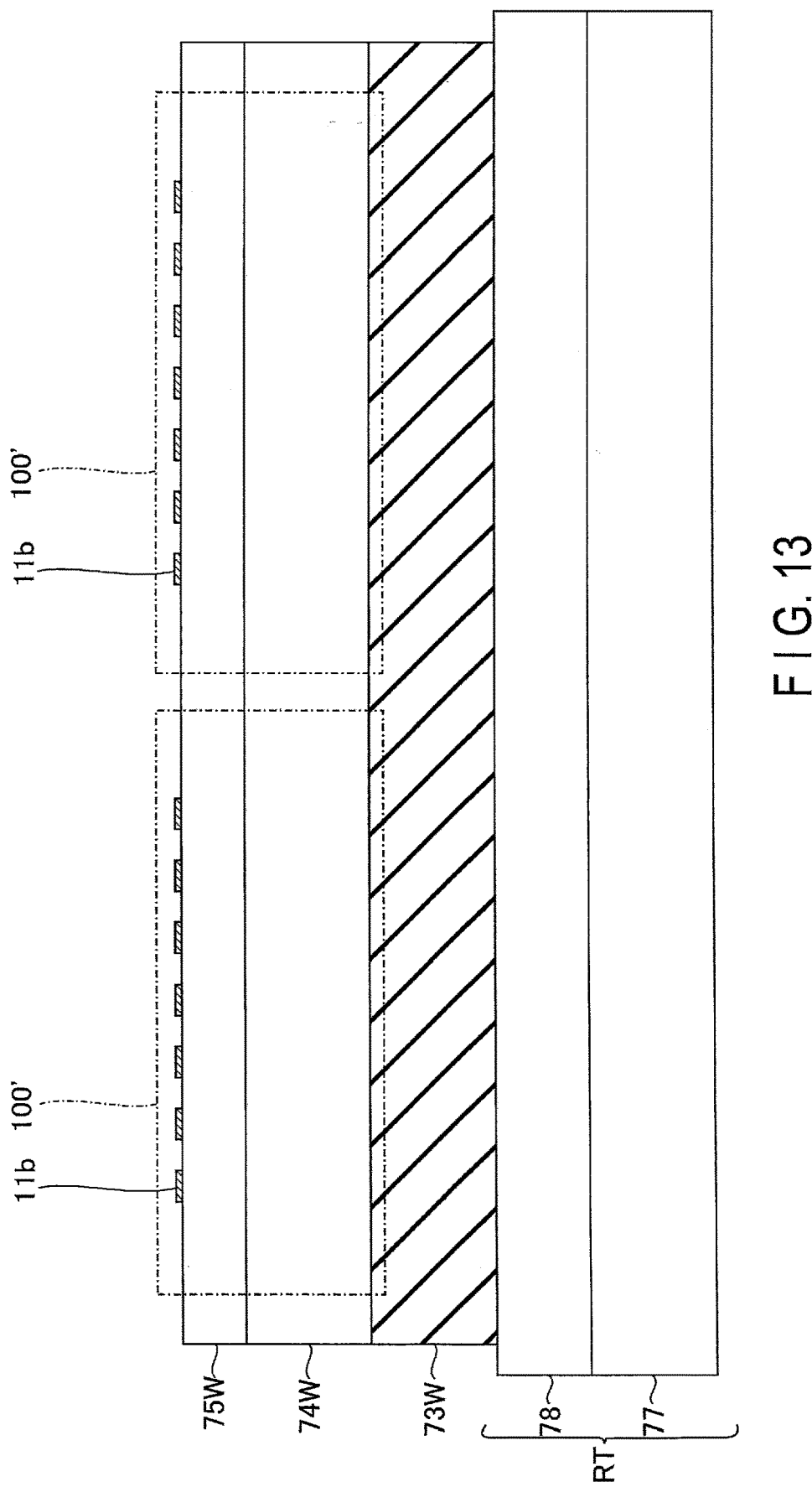
F I G. 13

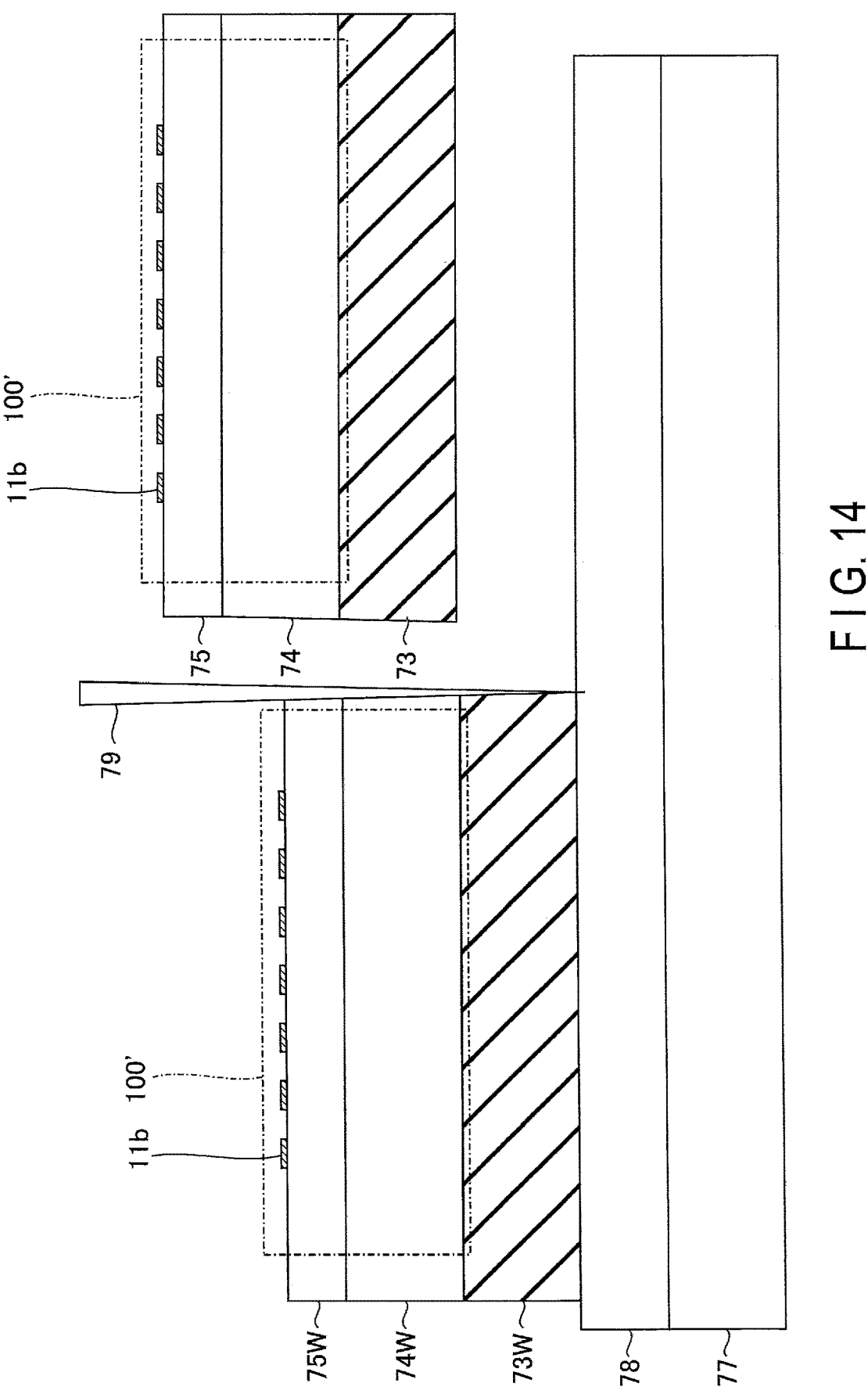
F I G. 14

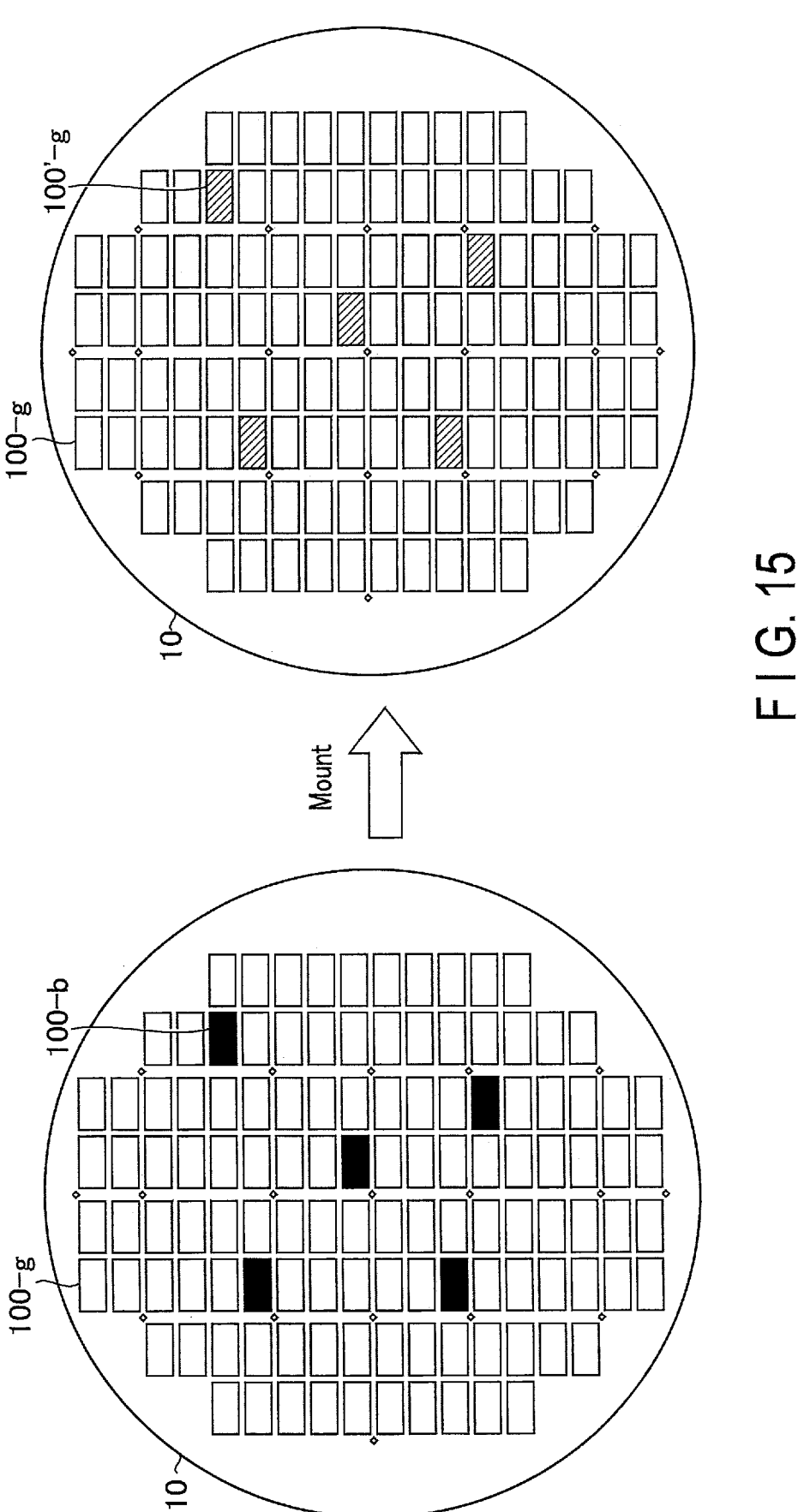
F I G. 15

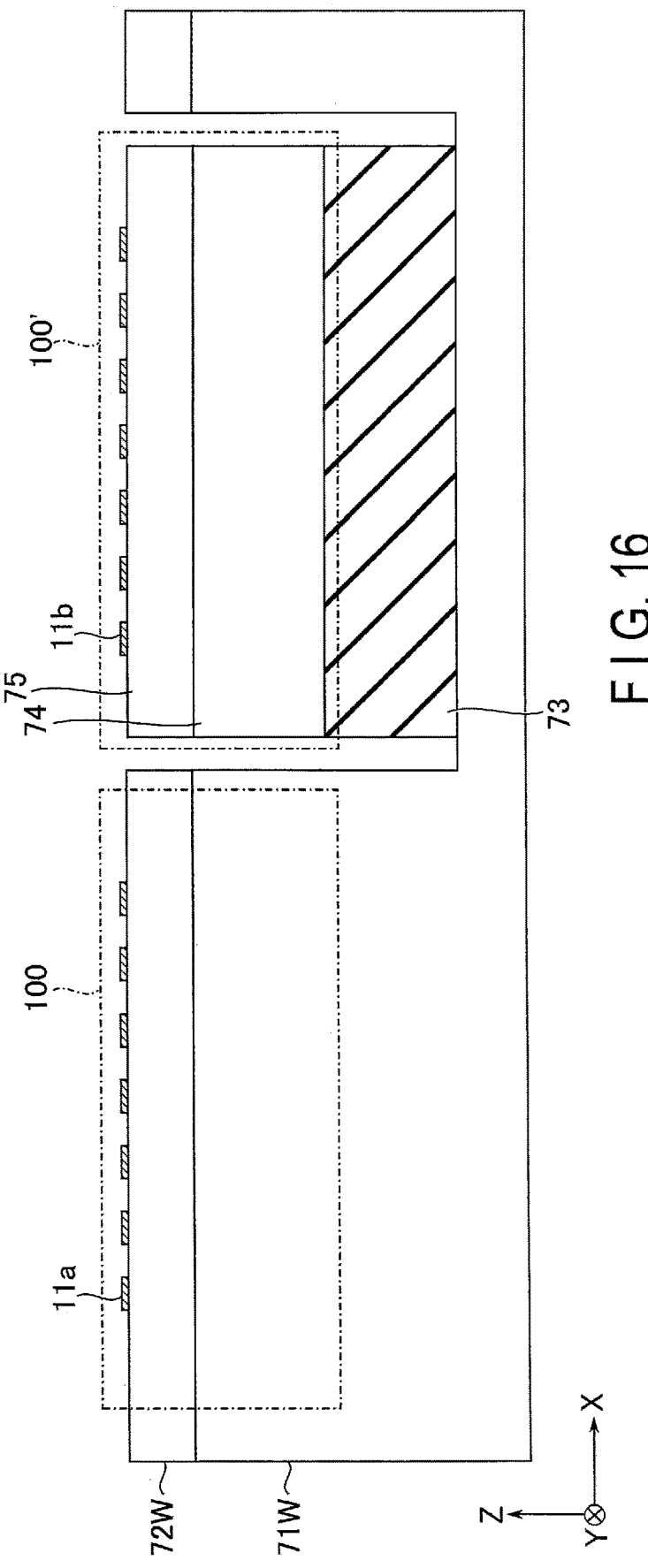
F I G. 16

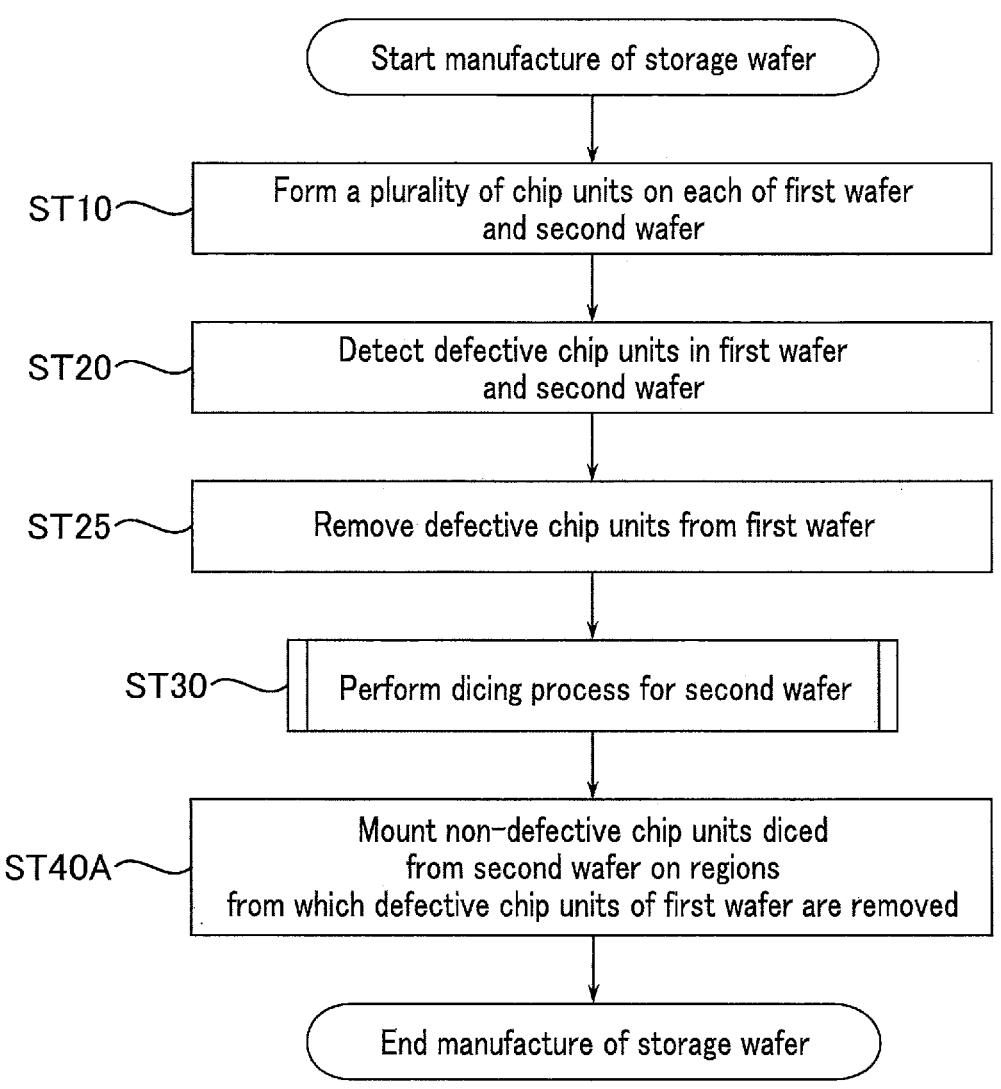
ST10 — Form a plurality of chip units on each of first wafer and second wafer
ST20 — Detect defective chip units in first wafer and second wafer
ST25 — Remove defective chip units from first wafer
ST30 — Perform dicing process for second wafer
ST40A — Mount non-defective chip units diced from second wafer on regions from which defective chip units of first wafer are removed
F I G. 17

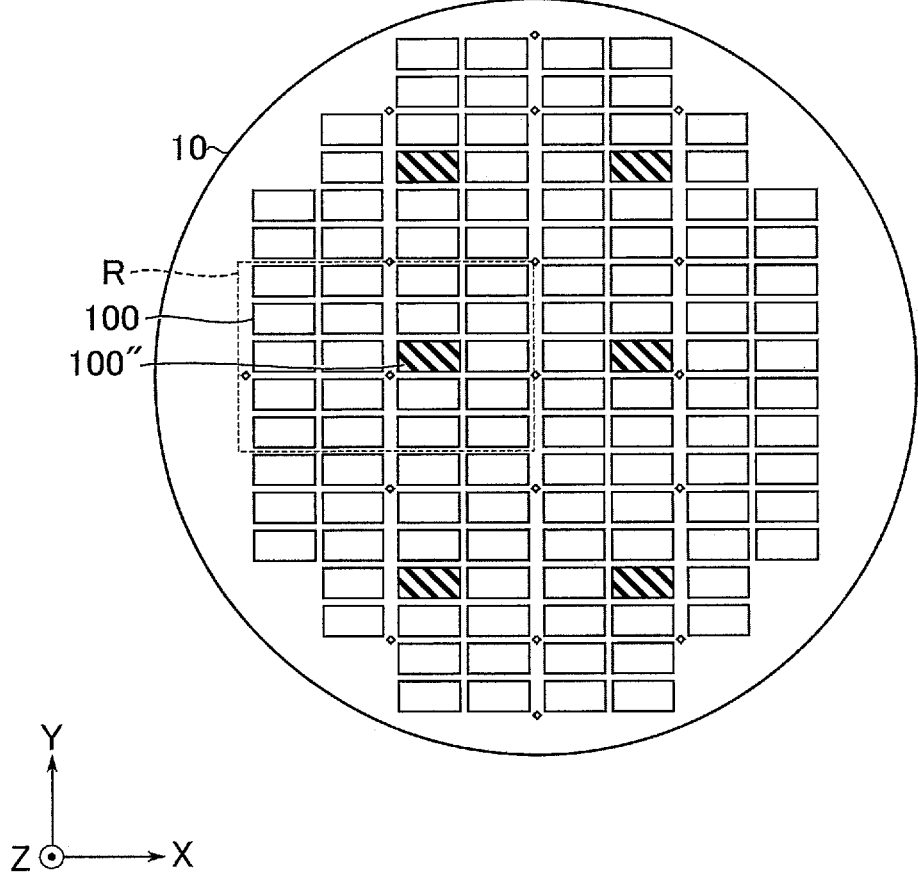
F I G. 18

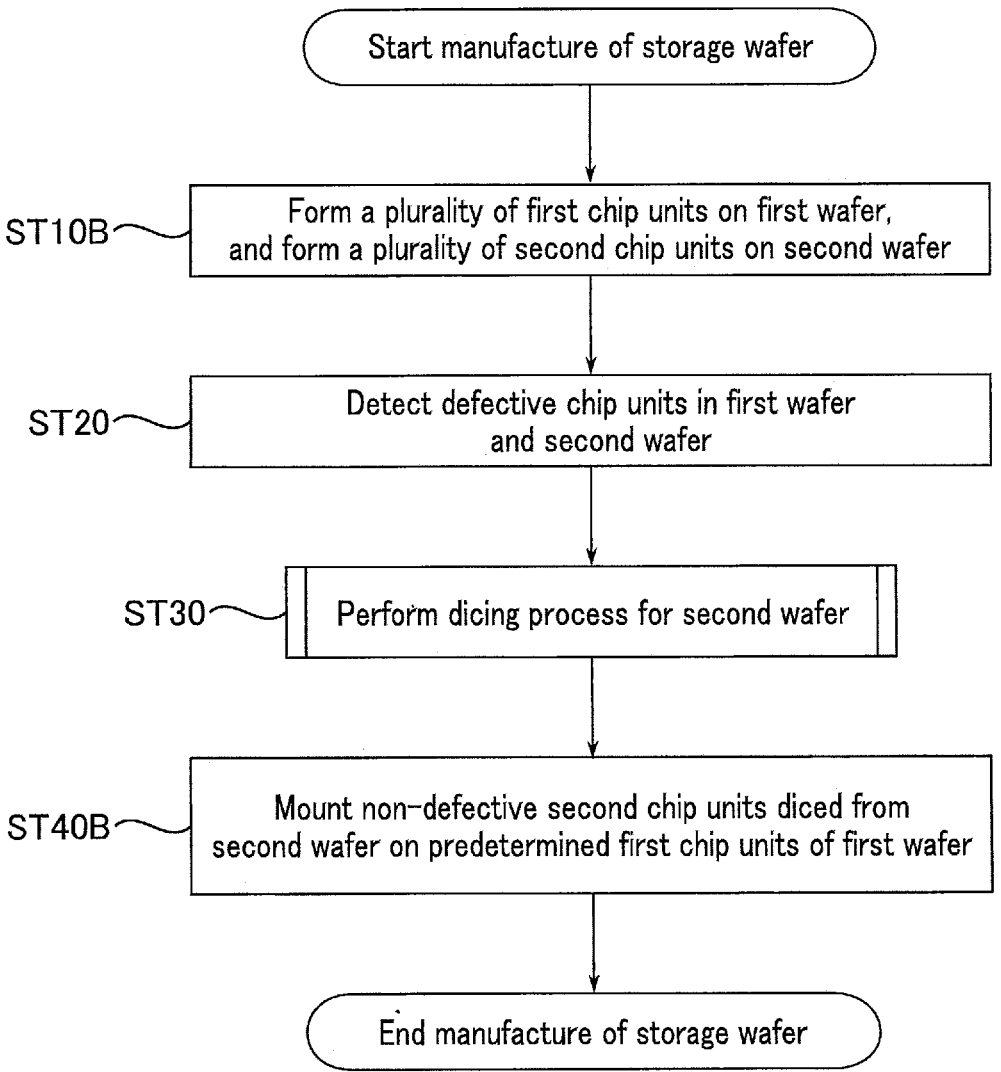

ST10B — Form a plurality of first chip units on first wafer, and form a plurality of second chip units on second wafer ST20 — Detect defective chip units in first wafer and second wafer ST30 — Perform dicing process for second wafer ST40B — Mount non-defective second chip units diced from second wafer on predetermined first chip units of first wafer Start manufacture of storage wafer End manufacture of storage wafer

F I G. 19

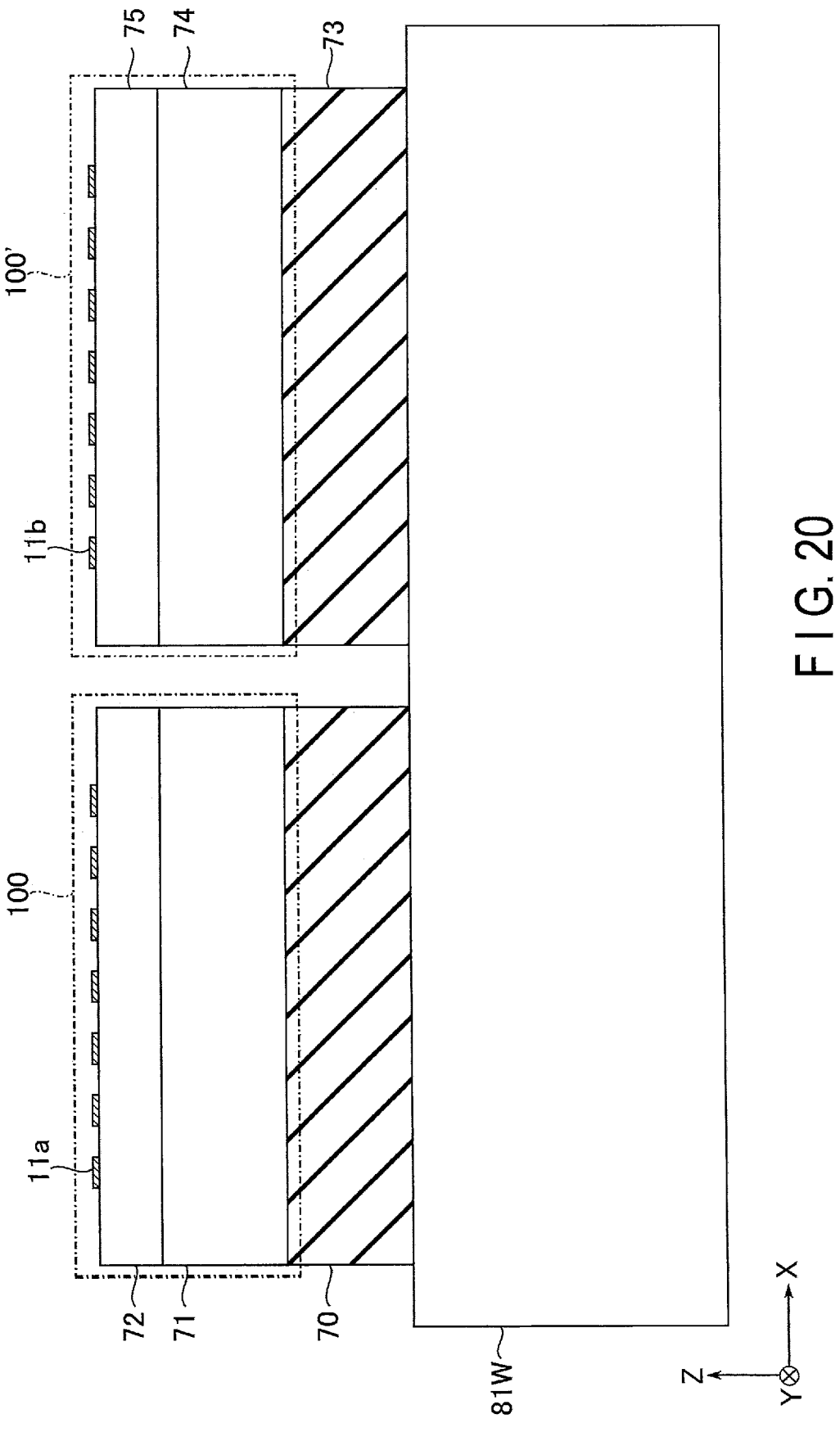
F I G. 20

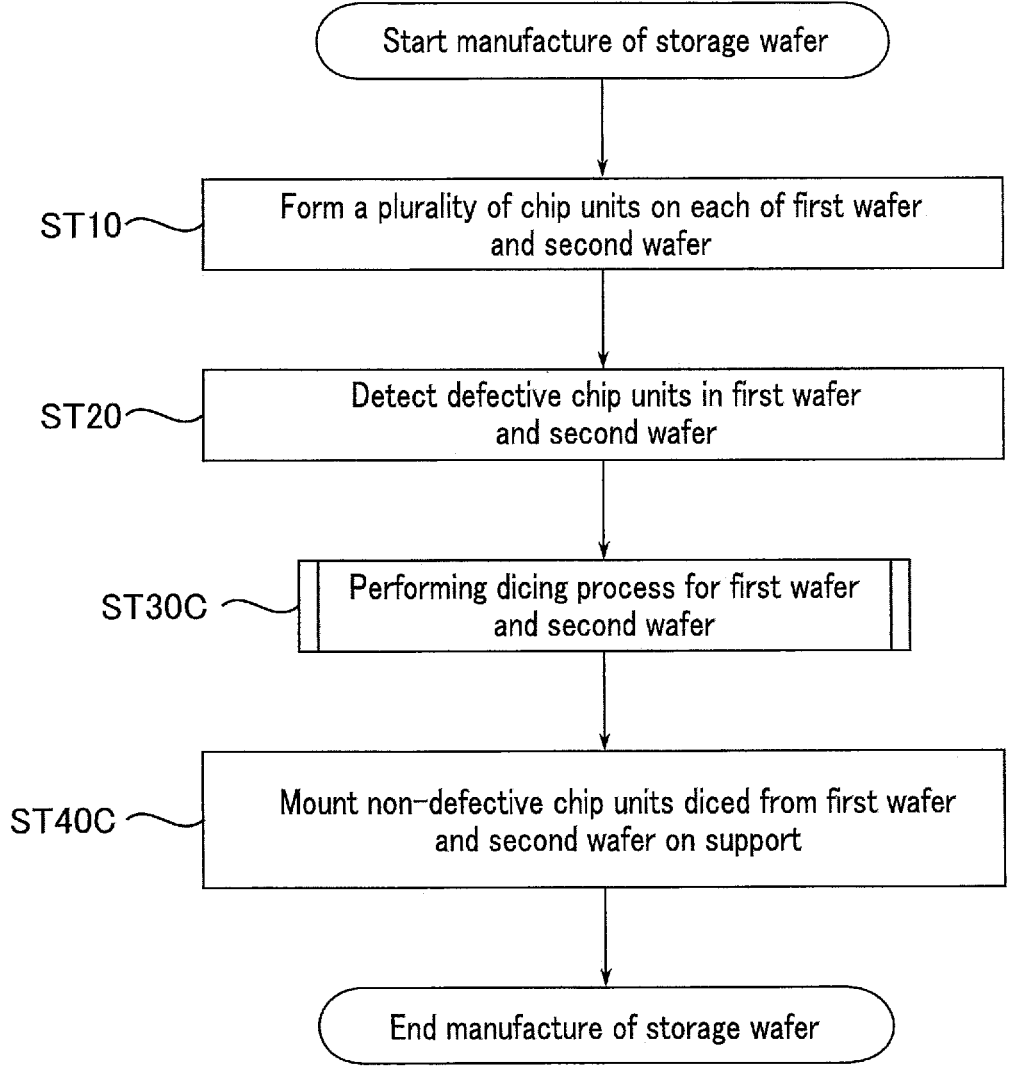
ST10 — Form a plurality of chip units on each of first wafer and second wafer
ST20 — Detect defective chip units in first wafer and second wafer
ST30C — Performing dicing process for first wafer and second wafer
ST40C — Mount non-defective chip units diced from first wafer and second wafer on support
Start manufacture of storage wafer
End manufacture of storage wafer
F I G. 21

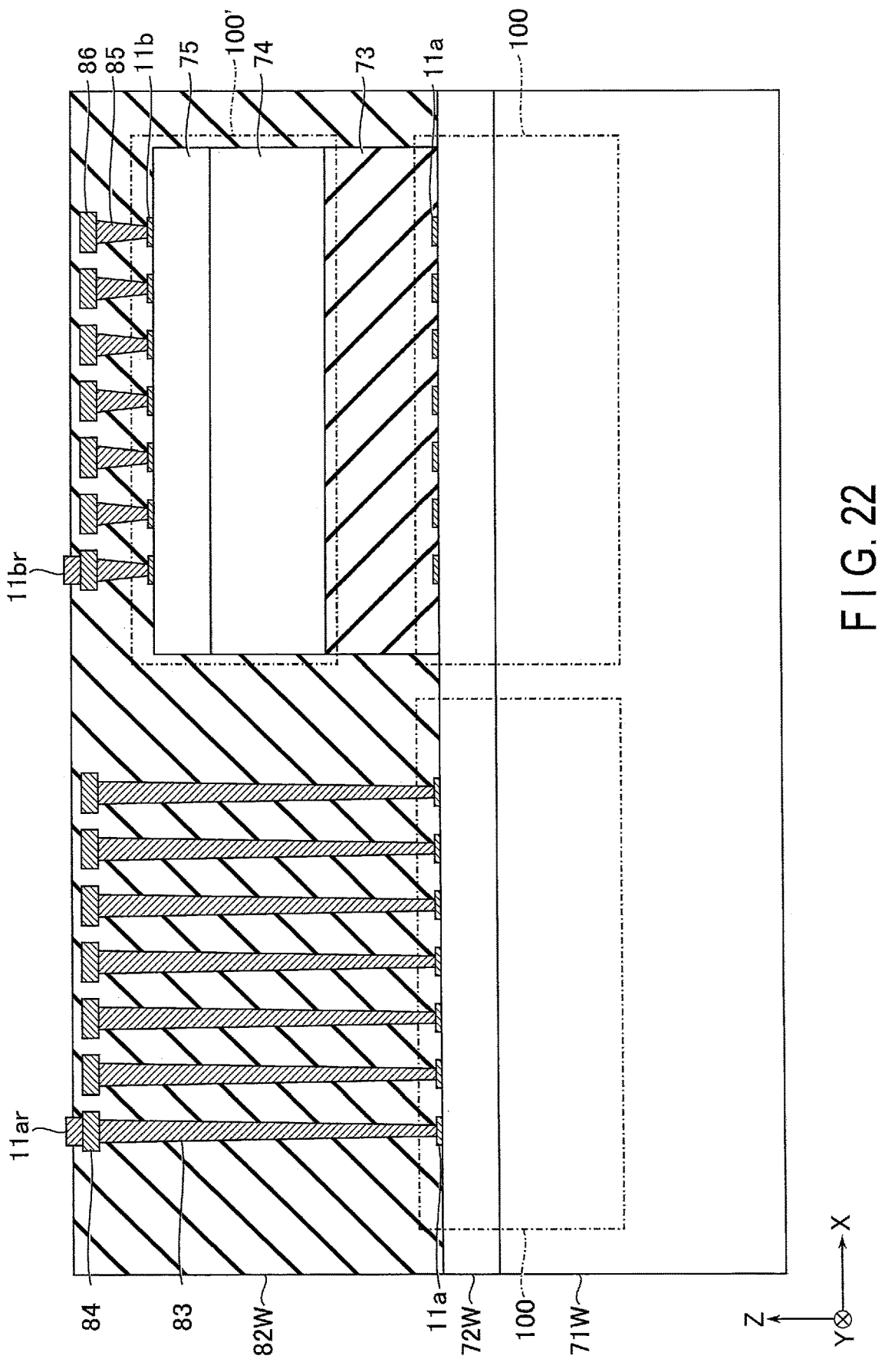
F I G. 22

STORAGE WAFER AND MANUFACTURING METHOD OF STORAGE WAFER

CROSS-REFERENCE TO RELATED APPLICATIONS

This application is a Continuation Application of PCT Application No. PCT/JP2020/032164, filed Aug. 26, 2020, the entire contents of which are incorporated herein by reference.

FIELD

Embodiments described herein relate generally to a storage wafer and a manufacturing method of storage wafer.

BACKGROUND

A wafer on which a plurality of NAND flash memories functioning as semiconductor memories are provided, and a prober for bringing a probe electrode into contact with a pad electrode on the wafer are known in the art.

BRIEF DESCRIPTION OF THE DRAWINGS

FIG. 1 is a block diagram for illustrating a configuration of a storage system according to a first embodiment.

FIG. 3 is a top view for illustrating a configuration of a probe card according to the first embodiment.

FIG. 4 is a top view for illustrating a configuration of a storage wafer according to the first embodiment.

FIG. 5 is a cross-sectional view of the storage wafer taken along line V-V shown in FIG. 4.

FIG. 6 is a block diagram for illustrating how the prober and the storage wafer are coupled according to the first embodiment.

FIG. 7 is a block diagram for illustrating a configuration of a NAND chip unit according to the first embodiment.

FIG. 8 is a circuit diagram for illustrating a configuration of a memory cell array according to the first embodiment.

FIG. 10 is a flowchart for illustrating a manufacturing method of the storage wafer according to the first embodiment.

FIG. 12 is a cross-sectional view of the second wafer for illustrating the dicing process of the second wafer according to the first embodiment.

FIG. 13 is a cross-sectional view of the second wafer for illustrating the dicing process of the second wafer according to the first embodiment.

FIG. 14 is a cross-sectional view of the second wafer for illustrating the dicing process of the second wafer according to the first embodiment.

FIG. 15 is a schematic diagram for illustrating a mount process of the NAND chip unit according to the first embodiment.

FIG. 16 is a cross-sectional view for illustrating a configuration of a storage wafer according to a second embodiment.

FIG. 17 is a flowchart for illustrating a manufacturing method of the storage wafer according to the second embodiment.

FIG. 18 is a top view for illustrating a configuration of a storage wafer according to a third embodiment.

FIG. 19 is a flowchart for illustrating a manufacturing method of the storage wafer according to the third embodiment.

FIG. 20 is a cross-sectional view for illustrating a configuration of a storage wafer according to a fourth embodiment.

FIG. 21 is a flowchart for illustrating a manufacturing method of the storage wafer according to the fourth embodiment.

FIG. 22 is a cross-sectional view for illustrating a configuration of a storage wafer according to a first modification.

DETAILED DESCRIPTION

Figure 2:
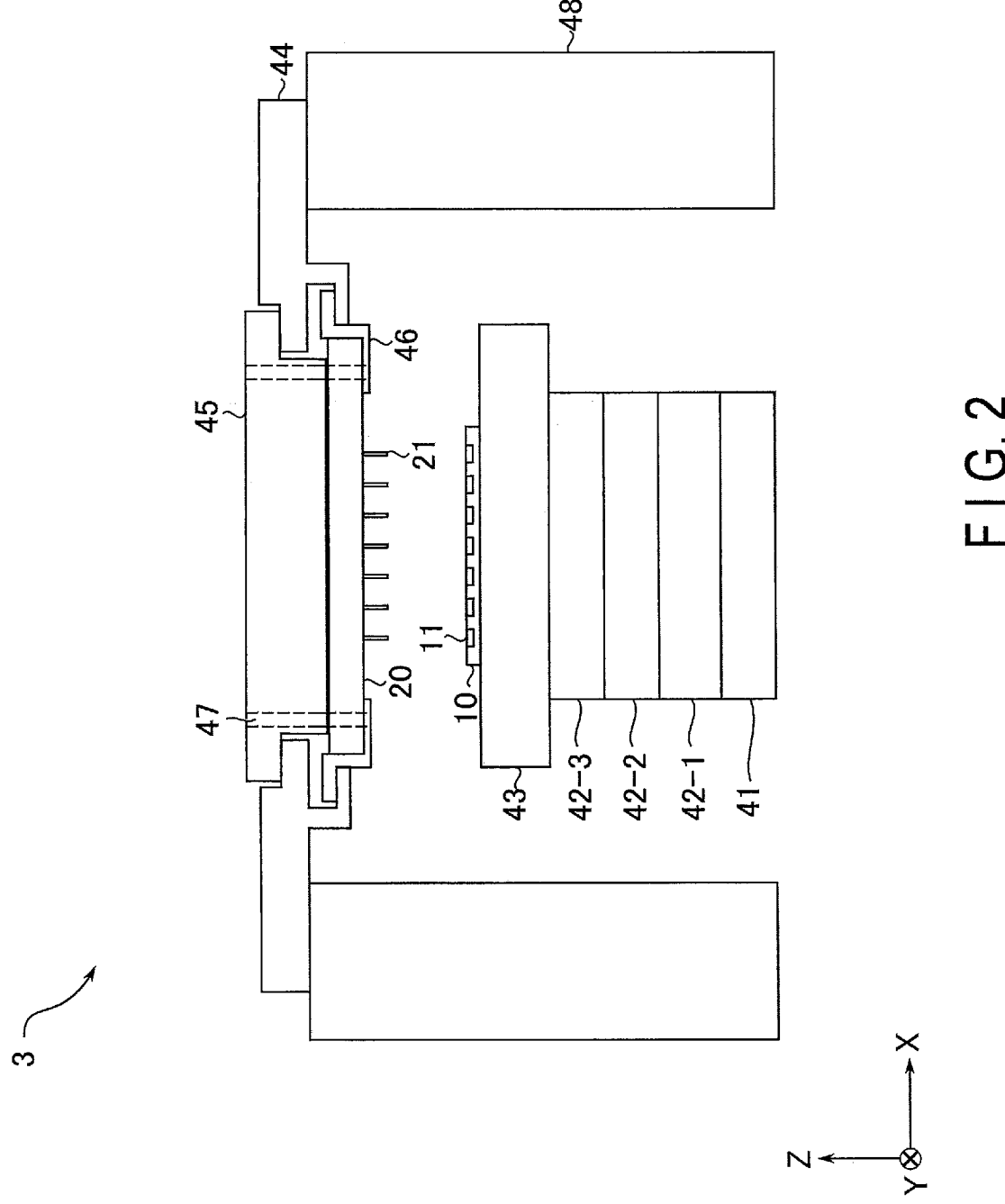
FIG. 2 is a side view for illustrating a structure of a prober according to the first embodiment.

In general, according to one embodiment, a storage wafer includes: a first semiconductor; a first element layer provided on an upper surface of the first semiconductor; a first pad provided on an upper surface of a first region of the first element layer; a second pad provided on an upper surface of a second region different from the first region of the first element layer; an adhesive film provided on the upper surface of the second region of the first element layer including the second pad; a second semiconductor provided on an upper surface of the adhesive film; a second element layer provided on an upper surface of the second semiconductor; and a third pad provided on an upper surface of the second element layer. The first element layer includes: a first memory chip unit electrically coupled to the first pad; and a second memory chip unit electrically coupled to the second pad. The second element layer includes an element electrically coupled to the third pad and electrically isolated from both the first pad and the second pad.

Embodiments will be described with reference to the accompanying drawings. In the descriptions below, components having similar functions and configurations will be denoted by the same reference symbols. To distinguish a plurality of components having common reference numerals, suffixes will be attached to the common reference numerals. If the components do not have to be distinguished particularly, only the common reference numerals will be used, and no suffixes will be attached.

1. First Embodiment

A storage system according to a first embodiment will be described. In the description set forth below, mention will be made of a storage system that comprises: a storage wafer provided with a plurality of NAND chip units (memory devices functioning as NAND flash memories); and a prober including a probe card on which a plurality of NAND controller chips are mounted and which is configured to bring the storage wafer into physical contact with a probe card for electrical coupling.

1.1 Configuration

The configuration of the storage system according to the first embodiment will be described.

1.1.1 Configuration of Storage System

First, the outline of the configuration of the storage system according to the first embodiment will be described with reference to FIG. 1. As shown in FIG. 1, the storage system 1 operates based on instructions supplied from the host device 2, for example. The storage system 1 includes a prober 3, a wafer carrier 4 and a wafer stocker 5.

The prober 3 is provided with a probe card 20 and a control unit 30, and either a storage wafer 10 or a cleaning wafer 10c is mounted thereon. The storage wafer 10 is an undiced wafer or a wafer obtained by rewiring an undiced wafer and includes a plurality of NAND flash memories provided in units of chips (hereinafter referred to as "NAND chip units", not shown), and a plurality of pad electrodes 11 are provided on the surface of the storage wafer 10. The cleaning wafer 10c is used for a cleaning process in which the electrical characteristics of the plurality of probe electrodes 21 provided on the probe card 20 are improved if the probe electrodes 21 deteriorate.

The probe card 20 includes a plurality of probe electrodes 21. Each of the plurality of probe electrodes 21 is electrically coupled to a chip-based memory controller (hereinafter referred to as a "NAND controller chip", not shown) mounted on the probe card 20.

The control unit 30 includes, for example, a temperature control system 31, a drive control system 32, and an interface control system 33, and controls the entire operation of the prober 3.

The temperature control system 31 controls the temperature environment to which the probe card 20 and the storage wafer 10 or the cleaning wafer 10c are exposed inside the prober 3. In the present embodiment, for example, the temperature control system 31 controls the temperatures of the probe card 20 and the storage wafer 10 or cleaning wafer 10c such that they do not change from a predetermined temperature.

The drive control system 32 is provided with a mechanism capable of freely moving the storage wafer 10 in three dimensions with respect to the probe card 20. By controlling the mechanism, the drive control system 32 has a function of bringing the plurality of pad electrodes 11 on the storage wafer 10 into contact with the corresponding probe electrodes 21 on the probe card 20.

The interface control system 33 controls communications between the host device 2 and the probe card 20. Further, the interface control system 33 controls the temperature control system 31, the drive control system 32, the wafer carrier 4, etc., based on control results of the communications.

The wafer carrier 4 has a function of carrying the storage wafer 10 or the cleaning wafer 10c between the prober 3 and the wafer stocker 5.

The wafer stocker 5 stores a plurality of storage wafers 10 and a cleaning wafer 10c that are not installed on the prober 3.

1.1.2 Configuration of Prober

Next, a description will be given of how the configuration of the prober is in the storage system according to the first embodiment, with reference to FIG. 2.

FIG. 2 is a side view schematically showing how the configuration of the prober 3 is in the state where the storage wafer 10 is installed. In the description below, the installation surface of the storage wafer 10 with respect to prober 3 will be defined as an XY plane, and the direction from the storage wafer 10 toward the probe card 20 and perpendicular to the XY plane will be defined as a Z direction (or an upward direction). The face of the storage wafer 10 facing the probe card 20 will be also referred to as the "surface" or "upper surface" of the storage wafer 10.

As shown in FIG. 2, the prober 3 includes a base 41, a plurality of stages 42 (42-1, 42-2 and 42-3), a wafer chuck 43, a head stage 44, a stiffener 45, a card holder 46, a fixing tool 47 and a support column 48.

A stage 42-1 is provided on the upper surface of the base 41 along with an X displacement mechanism (not shown). The stage 42-1 is configured such that the X displacement mechanism can freely move it in the X direction with respect to the base 41. A stage 42-2 is provided on the upper surface of the stage 42-1 along with a Y displacement mechanism (not shown). The stage 42-2 is configured such that the Y displacement mechanism can freely move it in the Y direction with respect to the stage 42-1. A stage 42-3 is provided on the upper surface of the stage 42-2 along with a ZO displacement mechanism (not shown). The stage 42-3 is configured such that the Zθ displacement mechanism can freely move it in the Z direction and freely rotate it in the XY plane with respect to the stage 42-2. The stages 42-1 to 42-3 are included in the drive control system 32 and are part of the mechanism that allows the position of the storage wafer 10 to freely change with respect to the probe card 20.

The wafer chuck 43 is provided on the upper surface of the stage 42-3 and supports the storage wafer 10. The wafer chuck 43 includes, for example, a temperature sensor, and a heater and a cooler (neither of which is shown) that can control the temperature of the storage wafer 10. The temperature control system 31 controls the heater and cooler, based on information from the temperature sensor, and controls the temperature of the storage wafer 10 by means of the wafer chuck 43. The temperature sensor, the heater and the cooler are included in the temperature control system 31.

The head stage 44 has, for example, a ring shape and is supported above the wafer chuck 43 by means of the support column 48. The stiffener 45 and the card holder 46, each of which has a ring shape, are provided such that they can be supported by the head stage 44 in the space inside the ring of the head stage 44. The stiffener 45 is provided above the probe card 20, and the probe card 20 is interposed between the stiffener 45 and the card holder 46. The card holder 46 supports the probe card 20 in the space inside the ring of the card holder 46. The probe card 20 is fixed to the stiffener 45 and the card holder 46 by means of the fixing tool 47, so that the position of the probe card 20 is fixed with respect to the wafer chuck 43 (and the storage wafer 10 on the wafer chuck 43), and displacement caused by thermal expansion or the like is suppressed.

The head stage 44 may be provided with a camera (not shown) for detecting representative positions (e.g., the outer edge of a wafer and alignment marks on the wafer) on the storage wafer 10 (or the cleaning wafer 10c). Based on the information from the camera, the drive control system 32 can recognize reference positions more accurately and thus enables precise alignment.

FIG. 3 is a top view of the probe card 20 fixed inside the prober 3.

As shown in FIG. 3, the probe card 20 has its outer circumferential portion fixed by the ring-shaped stiffener 45, and a plurality of NAND controller chips 200 are provided in the central portion of the probe card 20. In the storage system 1 according to the present embodiment, the inside of the prober 3 is kept at a substantially constant temperature by the temperature control system 31 and is not subjected to a large temperature change. Thus, the amount of displacement of the probe card 20 caused by thermal expansion or the like is suppressed to be small. For this reason, to suppress the displacement, the stiffener 45 is only required to fix the outer peripheral portion of the probe card 20, and a structure for fixing the central portion of the probe card 20 can be omitted. Thus, more chips can be mounted on the probe card 20.

FIG. 4 is a top view of the storage wafer 10 held by the wafer chuck 43.

As shown in FIG. 4, the storage wafer 10 includes a plurality of NAND chip units 100 and at least one NAND chip unit 100'. The NAND chip units 100 and 100' have similar configurations and functions, and each of them functions as a minimum unit memory device that can be controlled based on control signals from the NAND controller chip 200. A plurality of alignment marks 12 are provided in regions on the storage wafer 10 on which the NAND chip units 100 and 100' are not provided.

The plurality of NAND chip units 100 are arranged in a matrix on the upper surface of the storage wafer 10 when they are viewed in plan view. On the other hand, the one NAND chip unit 100' is provided on the upper surface of one of the plurality of NAND chip units 100 arranged in a matrix. The NAND chip unit 100' is selectively provided on the upper surface of a NAND chip unit 100 that is determined to be a defective chip unit during the manufacture of the storage wafer 10. Therefore, the number of NAND chip units 100' provided on the storage wafer 10 and the positions where the NAND chip units 100' are located may differ depending upon each storage wafer 10.

With reference to FIG. 5, a further description will be given as to how a cross-sectional structure is at the portion of the storage wafer 10 including both the NAND chip units 100 and 100'. FIG. 5 is a cross-sectional view of the storage wafer 10 taken along line V-V shown in FIG. 4.

As shown in FIG. 5, the storage wafer 10 includes a semiconductor substrate 71W, an element layer 72W, an adhesive film 73 (or a die attach film (DAF)), a semiconductor layer 74 and an element layer 75.

The semiconductor substrate 71W is a base material of the plurality of NAND chip units 100 and contains silicon (Si), for example. The element layer 72W is provided on the upper surface of the semiconductor substrate 71W. Various circuits functioning, for example, as a NAND flash memory, are formed on the semiconductor substrate 71W and the element layer 72W. In this manner, the element layer 72W, which is a continuous film, forms a plurality of NAND chip units 100 arranged in a matrix on the upper surface of the storage wafer 10. A plurality of pad electrodes 11*a* are formed on the upper surface of each of the plurality of NAND chip units 100. Thus, each of the plurality of NAND chip units 100 is configured such that it can communicate with the probe card 20 via the probe electrode 21.

A structure in which an adhesive film 73, a semiconductor layer 74 and an element layer 75 are stacked in this order is provided on the upper surfaces of NAND chip units 100 which are included among the plurality of NAND chip units 100 and which are determined to be defective. That is, the plurality of pad electrodes 11*a* provided on the upper surfaces of the NAND chip units 100 determined to be defective are sealed with the adhesive film 73.

The adhesive film 73 has a function of bonding the element layer 72W and the semiconductor layer 74 together. The adhesive film 73 is non-conductive and can electrically insulate the semiconductor layer 74 and the pad electrodes 11*a* on the element layer 72W.

The semiconductor layer 74 is a base material of the NAND chip unit 100' and contains silicon (Si), for example. An element layer 75 is provided on the upper surface of the semiconductor layer 74. Various circuits functioning as a NAND flash memory, for example, are formed on the semiconductor layer 74 and the element layer 75. The semiconductor layer 74 and the element layer 75 have a similar configuration to that of the portion of the semiconductor substrate 71W and the element layer 72W which functions as one NAND chip unit 100. In other words, the semiconductor layer 74 and the element layer 75 form one NAND chip unit 100'.

A plurality of pad electrodes 11*b* are formed on the upper surface of the NAND chip unit 100'. Thus, the NAND chip unit 100' is configured to communicate with the probe card 20 via the probe electrodes 21, in place of the NAND chip unit 100 located just below the NAND chip unit 100'.

Like the plurality of NAND chip units 100 formed on the semiconductor substrate 71W, the NAND chip units 100' are formed by cutting out from a semiconductor substrate (not shown) different from the semiconductor substrate 71W. In the description set forth below, the semiconductor substrate 71W on which the plurality of NAND chip units 100 are formed will be referred to as a "first wafer", and the semiconductor substrate which is different from the semiconductor substrate 71W and on which the plurality of NAND chip units 100' are formed will be referred to as a "second wafer". These wafers will be distinguished where necessary.

1.1.3 Communication Function Configuration Between Prober and Storage Wafer

Next, a description will be given with reference to the block diagram shown in FIG. 6 of the configuration enabling communications between the prober and storage wafer according to the first embodiment. FIG. 6 shows an example of how the coupling relationships are when the probe card 20 and the storage wafer 10 are brought into contact and electrically coupled to each other by the drive control system 32.

As shown in FIG. 6, the interface control system 33 is coupled to the host device 2 via a host bus. The host device 2 is, for example, a personal computer or the like, and the host bus is, for example, a bus conforming to PCIe (PCI EXPRESS™ (Peripheral component interconnect express)).

The interface control system 33 includes, for example, a host interface circuit 331, a CPU (Central processing unit) 332, a ROM (Read only memory) 333, and a RAM (Random access memory) 334. It should be noted that the functions of the units 331 to 334 of the interface control system 33 described below can be realized by either a hardware configuration or a combined configuration of hardware resources and firmware.

The host interface circuit 331 is coupled to the host device 2 via the host bus, and transfers commands and data received from the host device 2 to any of the NAND controller chips 200 according to instructions received from the CPU 332. The host interface circuit 331 also transfers data supplied from the NAND controller chips 200 to the host device 2 in response to commands from the CPU 332.

The CPU 332 mainly controls interfaces related to the data transmission performed in the prober 3. For example, upon reception of a write command from the host device 2, the CPU 332 determines which NAND controller chip 200 controls a write process in response to the write command, and transfers write data DAT to the determined NAND controller chip 200. Similar operations are performed in a read process and an erase process as well. The CPU 332 also executes various controls for other control systems (the temperature control system 31 and the drive control system 32) of the prober 3.

The ROM 333 stores firmware for controlling the temperature control system 31, drive control system 32 and the plurality of NAND controller chips 200.

The RAM 334 is, for example, a DRAM (Dynamic random access memory) or an SRAM (Static random access memory), and temporarily stores write data DAT and read data DAT. The RAM 334 is also used as a work area of the CPU 332 and stores various management tables, etc. An example of the management tables is a probe management table for managing information on how many times the probe electrodes 21 have been attached to, and detached from, the pad electrodes 11 on the storage wafer 10.

Each of the plurality of NAND controller chips 200 on the probe card 20 is electrically coupled to a set of NAND chip units 100 of the storage wafer 10.

In the example shown in FIG. 6, k NAND chip units 100_1 to 100_k are coupled in parallel to one NAND controller chip 200. The plurality of NAND controller chips 200, each coupled to k NAND chip units 100_1 to 100_k, control the k NAND chip units 100_1 to 100_k in parallel, based on instructions supplied from the interface control system 33.

Some of the k NAND chip units 100_1 to 100_k coupled to the NAND controller chip 200 can be replaced with NAND chip units 100'. The example in FIG. 6 is a case where in one of the two NAND controller chips 200, none of the k NAND chip units 100_1 to 100_k are replaced with the NAND chip unit 100'. In the other one of the two NAND controller chips 200, the NAND chip unit 100_2 included in the k NAND chip units is replaced with the NAND chip unit 100'_2. In this case, the NAND chip unit 100_2 replaced with the NAND chip unit 100'_2 is not coupled to the NAND controller chip 200.

The NAND controller chip 200 is, for example, an SoC (System-on-a-chip) having an FPGA (Field programmable gate array) function, and includes a CPU 210, a ROM 220, a RAM 230, an error check and correction circuit 240 and a NAND interface circuit 250. It should be noted that the functions of the units 210 to 250 of the NAND controller chip 200 described below can be realized by either a hardware configuration or a combined configuration of hardware resources and firmware.

The CPU 210 controls the entire operation of the NAND controller chip 200. For example, upon reception of a write command supplied from the host device 2 via the interface control system 33, the CPU 210 issues a write command to the NAND interface circuit 250 in response to the write command. Similar operations are performed in a read process and an erase process as well. The CPU 210 also executes various processes for controlling the NAND chip units 100 and 100'.

The ROM 220 stores firmware etc. for controlling the NAND chip units 100 and 100'.

The RAM 230 is, for example, a DRAM, and temporarily stores write data and read data DAT. The RAM 230 is also used as a work area of the CPU 210 and stores various management tables, etc.

The error check and correction circuit 240 performs an error detection process and an error correction process for data stored in the NAND chip units 100 and 100'. In other words, the error check and correction circuit 240 generates an error correction code for a data write process, applies it to the write data DAT, and decodes it during a data read process to detect whether or not there is an error bit. If an error bit is detected, the position of the error bit is identified and the error is corrected. The method of error correction includes, for example, hard bit decoding and soft bit decoding. As an example of a hard bit decoding code used for the hard bit decoding, a BCH (Bose-Chaudhuri-Hocquenghem) code, an RS (Reed-Solomon) code or the like can be used, and as an example of a soft bit decoding code used for the soft bit decoding, an LDPC (Low Density Parity Check) code or the like can be used.

The NAND interface circuit 250 is coupled to the NAND chip units 100 and 100' via a NAND bus and performs communications with the NAND chip units 100 and 100'. Based on the instructions received from the CPU 210, various signals are output to the NAND chip units 100 and 100'. At the time of a write process, a write command issued by the CPU 210 and write data DAT stored in the RAM 230 are transferred to the NAND chip units 100 and 100' as input/output signals. Furthermore, at the time of the read process, a read command issued by the CPU 210 is transferred to the NAND chip units 100 and 100' as an input/output signal, and data DAT read from the NAND chip units 100 and 100' is received as an input/output signal and transferred to the RAM 230.

With the configuration described above, all NAND chip units 100 and 100' provided in the storage wafer 10 can be controlled in parallel.

1.1.4 Configuration of NAND Chip Unit

Next, a description will be given of the configuration of the NAND chip unit according to the first embodiment.

FIG. 7 is a block diagram showing the functional configuration of the NAND chip unit according to the first embodiment. FIG. 7 shows details of how the coupling relationships shown in FIG. 6 are between one NAND controller chip 200 and one NAND chip unit 100 or 100'. It should be noted that the coupling relationships shown in FIG. 7 are not applicable to the NAND chip unit 100 that is replaced with the NAND chip unit 100' and that is not coupled to the NAND controller chip 200.

As shown in FIG. 7, the NAND chip units 100 and 100' are coupled to the NAND controller chip 200 of the probe card 20 by a NAND bus. The NAND bus is a transmission line used for transmitting and receiving signals compatible with the NAND interface, and includes probe electrodes 21 and pad electrodes 11.

Specific examples of the signals compatible with the NAND interface are a chip enable signal CEn, a command latch enable signal CLE, an address latch enable signal ALE, a write enable signal WEn, a read enable signal REn, a ready/busy signal RBn, and an input/output signal I/O. In the description below, where "n" is added as a suffix to a signal name, the signal in question has a negative logic. In other words, "n" indicates that the signal is a signal asserted at "L (Low)" level.

The signal CEn is a signal for enabling the NAND chip units 100 and 100' and is asserted at "L" level. The signals CLE and ALE are signals for notifying the NAND chip units 100 and 100' that an input signal I/O to the NAND chip units 100 and 100' includes a command CMD and an address ADD. The signal WEn is a signal that is asserted at "L" level and used for causing the NAND chip units 100 and 100' to receive the input signal I/O. The signal REn is a signal that is also asserted at "L" level and reads the output signal I/O from the NAND chip units 100 and 100'. The ready/busy signal RBn indicates whether the NAND chip units 100 and 100' are in a ready state (e.g., a state in which they can receive commands from the NAND controller chip 200) or in a busy state (e.g., a state in which they cannot receive commands from the NAND controller chip 200). The ready/busy signal RBn indicates the busy state when it is at "L" level. The input/output signal I/O is, for example, an 8-bit signal. The input/output signal I/O is the data transmitted and received between the NAND chip units 100 and 100' and the NAND controller chip 200, and includes a command CMD, an address ADD, and data DT such as write data and read data.

The NAND chip units 100 and 100' are supplied with voltages VCC and VSS, for example, from the NAND controller chip 200 via the probe electrodes 21 and the pad electrodes 11. The voltages VCC and VSS are a power supply voltage and a ground voltage used in the NAND chip units 100 and 100'.

The NAND chip units 100 and 100' include a memory cell array 110 and a peripheral circuit 120.

The memory cell array 110 includes a plurality of blocks BLK each including a plurality of nonvolatile memory cells associated with rows and columns. The blocks BLK are, for example, units of data erasing, and FIG. 7 shows four blocks BLK0 to BLK3 by way of example. The memory cell array 110 stores data provided by the NAND controller chip 200.

The peripheral circuit 120 includes an I/F circuit 121, a command register 126, an address register 127, a data register 128, a driver 129, a row decoder 130, a sense amplifier module 131 and a sequencer 132.

The I/F circuit 121 is a circuit group that mainly manages the interface between the pad electrodes 11 and other peripheral circuits 120 inside the NAND chip units 100 and 100', and includes an input/output circuit 122, a logic control circuit 123, a timing adjustment circuit 124 and an error check and correction circuit 125.

The input/output circuit 122 transmits/receives signals I/O to/from the NAND controller chip 200. Upon reception of a signal I/O from the NAND controller chip 200, the input/output circuit 122 disassembles the signal I/O into a command CMD, an address ADD and data DAT, based on information supplied from the logic control circuit 123. The input/output circuit 122 transfers the command CMD to the command register 126 and transfers the address ADD to the address register 127. Also, the input/output circuit 122 transmits and receives write data and read data DAT to and from the data register 128.

The logic control circuit 123 receives the signals CEn, CLE, ALE, WEn and REn from the NAND controller chip 200, and transmits information for identifying the command CMD, address ADD and data DAT of the signal I/O to the input/output circuit 122. Also, the logic control circuit 123 transfers the signal RBn to the NAND controller chip 200 to notify the NAND controller chip 200 of the states of the NAND chip units 100 and 100'.

The timing adjustment circuit 124 is, for example, a latch circuit, is provided between the pad electrode 11, and the input/output circuit 122 and logic control circuit 123, and adjusts the timing of signals.

The error check and correction circuit 125 is provided, for example, between the input/output circuit 122 and the command register 126, address register 127 and data register 128, and performs an error detection process and an error correction process for data stored in the NAND chip units 100 and 100'. The error check and correction circuit 125 has a configuration similar to that of the error check and correction circuit 240 and is configured such that it can decode data encoded by the error check and correction circuit 240. That is, in a data write process, write data DAT to which an error correction code is added by the error check and correction circuit 240 is decoded to detect whether or not there is an error bit. Where an error bit is detected, the position of the error bit is identified and the error is corrected. Further, in a data read process, read data DAT to which an error correction code is added by the error check and correction circuit 240 is decoded to detect whether or not there is an error bit. Where an error bit is detected, the position of the error bit is identified, the error is corrected, and then the read data DAT is encoded again and sent to the NAND controller chip 200.

The command register 126 stores a command CMD received from the NAND controller chip 200. The address register 127 stores an address ADD received from the NAND controller chip 200. This address ADD includes a block address BA and a page address PA. The data register 128 stores write data DAT received from the NAND controller chip 200 or read data DAT received from the sense amplifier module 131.

The driver 129 supplies a voltage to the row decoder 130 of a selected block BLK, based on the page address PA stored in the address register 127.

The row decoder 130 selects one of the blocks BLK0 to BLK3, based on the block address BA stored in the address register 127, and further selects a word line in the selected block BLK.

At the time of data read, the sense amplifier module 131 reads data by sensing the threshold voltage of the memory cell transistor in the memory cell array 110. The read data DAT is output to the NAND controller chip 200 via the data register 128. At the time of data write, write data DAT received from the NAND controller chip 200 via the data register 128 is transferred to the memory cell array 110.

The sequencer 132 controls the entire operation of the NAND chip units 100 and 100', based on the command CMD stored in the command register 126.

1.1.5 Configuration of Memory Cell Array

Next, a configuration of the memory cell array 110 will be described.

FIG. 8 is a circuit diagram of one block BLK included in the memory cell array 110.

As shown in FIG. 8, the block BLK includes, for example, four string units SU (SU0 to SU3). Each string unit SU includes a plurality of NAND strings NS. The number of blocks in the memory cell array 110 and the number of string units in the block BLK are freely designed.

Each of the NAND strings NS includes, for example, eight memory cell transistors MT (MT0 to MT7) and two selection transistors ST1 and ST2. Each of the memory cell transistors MT includes a control gate and a charge storage film, and stores data in a nonvolatile manner. The memory cell transistors MT are coupled in series between the source of the selection transistor ST1 and the drain of the selection transistor ST2.

The gates of the selection transistors ST1 included in the NAND strings NS of the string units SU0 to SU3 are coupled to select gate lines SGD0 to SGD3, respectively. On the other hand, the gates of the selection transistors ST2 included in the NAND strings NS of the string units SU0 to SU3 are commonly coupled to, for example, a select gate line SGS. Alternatively, the gates of the selection transistors ST2 included in the NAND strings NS of the string units SU0 to SU3 may be coupled to different select gate lines SGS0 to SGS3 of the string units. The control gates of the memory cell transistors MT0 to MT7 included in the NAND strings NS of the same block BLK are commonly coupled to word lines WL0 to WL7, respectively.

The drains of the selection transistors ST1 of the NAND strings NS of the same column included in the blocks of the memory cell array 110 are commonly coupled to a bit line BL (one of bit lines BL0 to BLm, where m is a natural number of 2 or more). That is, the bit line BL commonly couples the NAND strings NS of the same column of the plurality of blocks BLK. The sources of the selection transistors ST2 are commonly coupled to a source line SL.

That is, the string unit SU is an aggregation of a plurality of NAND strings NS that are coupled to different bit lines BL and that are coupled to the same select gate line SGD. An aggregation of the memory cell transistors MT included in the string unit SU and commonly coupled to the same word line WL is also referred to as a cell unit CU (or a memory cell group). The block BLK is an aggregation of a plurality of string units SU that share the word line WL. The memory cell array 110 is an aggregation of a plurality of blocks BLK that share the bit lines BL.

Figure 9:
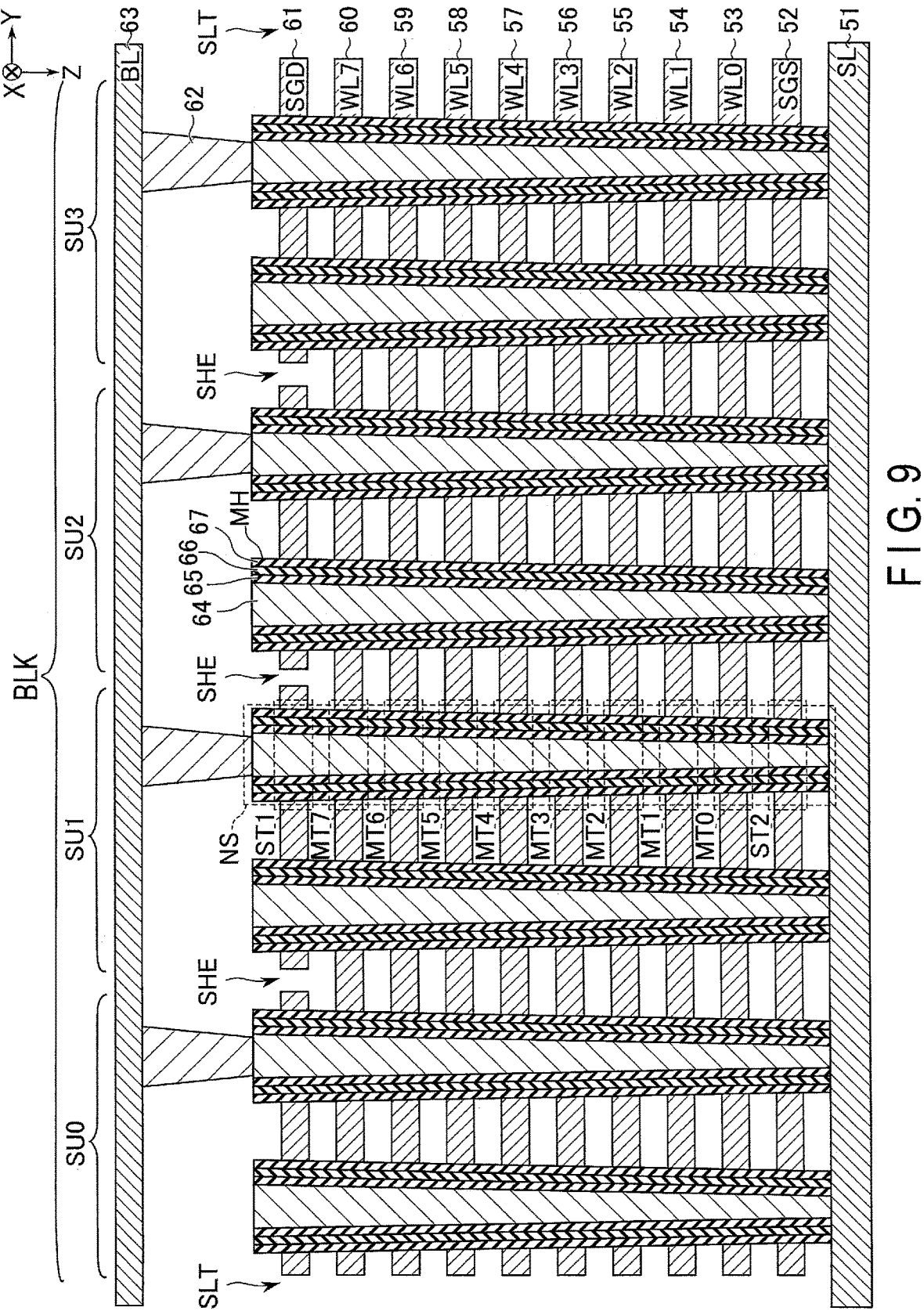
FIG. 9 is a cross-sectional view for illustrating the configuration of the memory cell array according to the first embodiment.

FIG. 9 is a cross-sectional view of one block BLK and shows eight NAND strings NS arranged along the Y direction. Of the eight NAND strings NS, four sets of NAND strings NS, each including two NAND strings NS arranged along the Y direction, correspond to string units SU0, SU1, SU2 and SU3, respectively.

As shown in FIG. 9, a plurality of NAND strings NS are formed above a conductor 51, which functions as a source line SL. In other words, a conductor 52 functioning as a select gate line SGS, eight layers of conductors 53 to 60 respectively functioning as word lines WL0 to WL7, and a conductor 61 functioning as a select gate line SGD are sequentially stacked above the conductor 51. An insulator, not shown, is formed between the stacked conductors. Between the blocks BLK, the conductors 52-61 are divided by insulators SLT, which are not shown. The conductor 61 is also divided by insulators SHE (not shown) between the string units SU. Thus, the conductors 61 are shorter than the conductors 52-60 along the Y direction.

A pillar-shaped conductor 64 is formed, passing through these conductors 61-52 and reaching the conductor 51. On the side face of the conductor 64, a tunnel insulating film 65, a charge storage film 66, and a block insulating film 67 are sequentially formed. By these, memory cell transistors MT and selection transistors ST1 and ST2 are formed. The conductor 64 contains, for example, polysilicon, functions as a current path of the NAND string NS, and provides an area in which the channel of each transistor is formed. Each of the tunnel insulating film 65 and the block insulating film 67 contains, for example, silicon oxide ($SiO_2$), and the charge storage film 66 contains, for example, silicon nitride (SiN). A conductor 63 functioning as a bit line BL is provided above the conductor 64. The conductor 64 and the conductor 63 are electrically coupled to each other via a conductor 62 functioning as a contact plug, for example. In the example shown in FIG. 9, four NAND strings NS included among the eight NAND strings NS arranged along the Y direction and corresponding to the string units SU0 to SU3, respectively, are electrically coupled to one conductor 63.

The configuration described above is repeatedly arranged in the X direction, and a block BLK is formed by a set of NAND strings NS arranged in the X direction. A memory cell array 110 is formed by arranging a plurality of blocks BLK in the Y direction.

1.2 Manufacturing Method

Next, a description will be given of a method for manufacturing a storage wafer according to the first embodiment.

1.2.1 Flowchart

FIG. 10 is a flowchart illustrating a manufacturing method of a storage wafer according to the first embodiment. FIG. 10 shows a method in which the storage wafer 10 is manufactured using a first wafer on which a plurality of NAND chip units 100 are to be formed and a second wafer on which a plurality of NAND chip units 100' are to be formed.

As shown in FIG. 10, in step ST10, a plurality of chip units are formed on each of the first wafer and the second wafer. Specifically, a plurality of NAND chip units 100 are formed on the first wafer, and a plurality of NAND chip units 100' are formed on the second wafer.

In step ST20, defective chip units are detected in each of the first wafer and the second wafer by performing, for example, a probing process on each of the formed chip units. By this process, NAND chip units 100 on which the non-defective NAND chip units 100' are to be mounted are specified from among the plurality of NAND chip units 100 formed on the first wafer. Whether or not the NAND chip unit is non-defective can be determined based on a predetermined condition, for example, by checking whether or not the capacity of the memory for which write and read can be normally performed is equal to or greater than a threshold value.

In step ST30, the second wafer is diced to individually separate the plurality of NAND chip units 100'. Of the plurality of NAND chip units 100' individually separated from each other, the NAND chip units 100' determined to be non-defective in step ST20 are extracted and used in the subsequent step.

In step ST40, non-defective NAND chip units 100' diced from the second wafer are mounted on the upper surfaces of defective NAND chip units 100 included among the plurality of chip units 100 formed on the first wafer.

In this manner, the manufacture of the storage wafer 10 is completed.

1.2.2 Dicing Process

Next, a description will be given with reference to FIGS. 11 to 14 as to the dicing process involved in the storage wafer manufacturing method according to the first embodiment. FIGS. 11 to 14 are cross-sectional views showing how the second wafer is in the dicing process of the second wafer when the storage wafer according to the first embodiment is manufactured. The second wafer is, for example, a wafer whose base material is a semiconductor substrate 74W containing silicon (Si). In step ST10 shown in FIG. 10, it is assumed that a plurality of NAND chip units 100' are formed by providing an element layer 75W on the semiconductor substrate 74W. The semiconductor layer 74 and element layer 75 described above with reference to FIG. 5 etc. are portions of the semiconductor substrate 74W and the element layer 75W, respectively.

Figure 11:
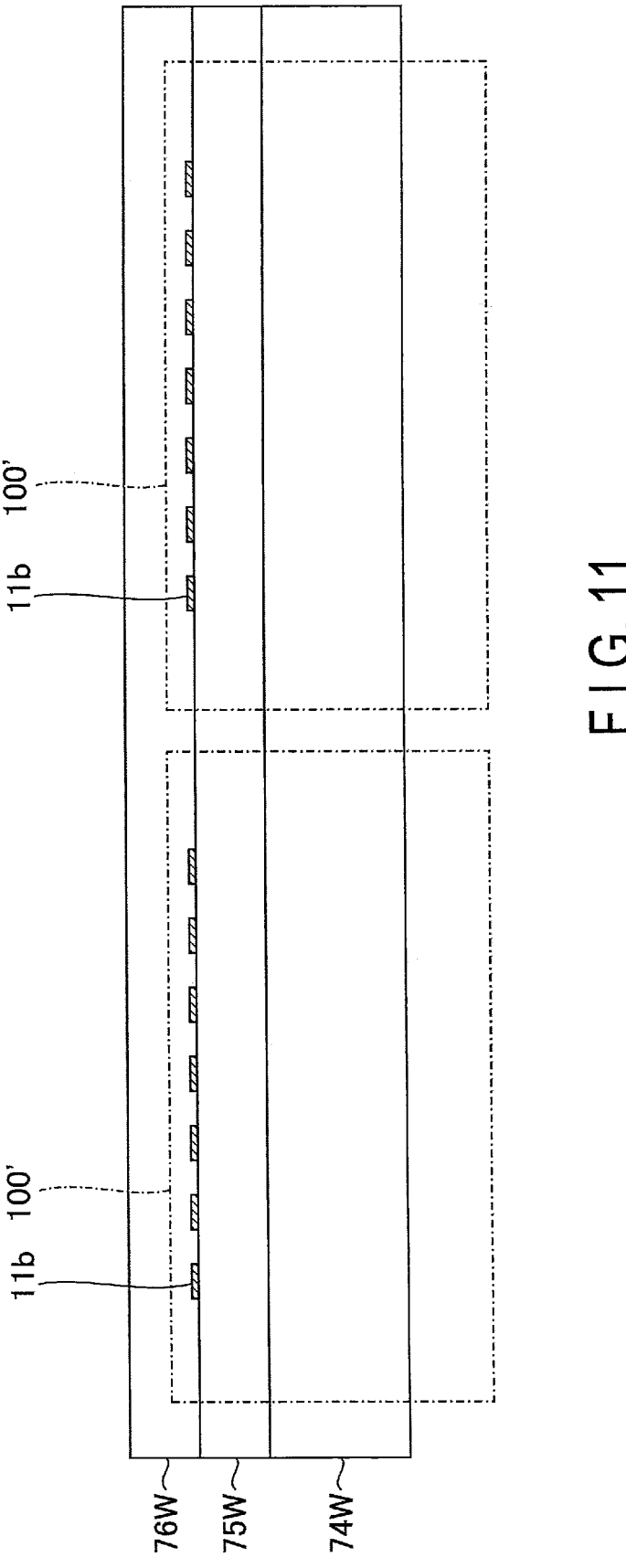
FIG. 11 is a cross-sectional view of a second wafer for illustrating a dicing process of the second wafer according to the first embodiment.

As shown in FIG. 11, a protective film 76W is attached to the entire upper surface of the element layer 75W. Thus, a plurality of pad electrodes 11b exposed in the top are covered with the protective film 76, and the plurality of NAND chip units 100' are protected thereby. Thereafter, the back surface of the semiconductor substrate 74W is ground. Thus, the semiconductor substrate 74W is thinned while maintaining flatness.

Subsequently, as shown in FIG. 12, an adhesive film 73W is attached to the entire back surface of the semiconductor substrate 74W. The adhesive film 73 is a portion of the adhesive film 73W described above with reference to FIG. 5 etc.

Subsequently, as shown in FIG. 13, the back surface of the adhesive film 73W is adhered onto the top surface of a ring tape RT, and the second wafer is thus fixed to the ring tape RT. The ring tape RT includes a base material 77 and a sticky film 78 attached to the base material 77. The base material 77 is, for example, a thin plastic film, and its outer periphery is supported by a ring frame (not shown). The sticky film 78 fixes the second wafer to such an extent that the NAND chip units 100' are not scattered when they are separated individually by a dicing process of the second wafer, mentioned later, and they can be easily peeled off in a pickup process, described below.

Subsequently, as shown in FIG. 14, the second wafer is diced with a dicing blade 79, and the adhesive film 73W, the semiconductor substrate 74W and the element layer 75W are separated into structures each of which functions as a NAND chip unit 100' and includes an adhesive film 73, a semiconductor layer 74 and an element layer 75. Thereafter, the structure each functioning as the NAND chip unit 100' is picked up and separated from the sticky film 78.

In this manner, the dicing process for the second wafer is completed.

The back surface of the adhesive film 73 separated from the sticky film 78 is adhered to the upper surface of the defective NAND chip unit 100 of the first wafer separately prepared. Thus, the storage wafer 10 shown in FIG. 5 is manufactured.

1.3 Advantageous Effects of Present Embodiment

According to the first embodiment, the percentage of non-defective chips on the wafer can be increased. This effect will be described below with reference to FIG. 15.

FIG. 15 is a schematic diagram for illustrating a mount process in which NAND chip units according to the first embodiment are mounted. As shown in the left portion of FIG. 15, the element layer 72W is formed over the entire upper surface of the semiconductor substrate 71W by executing one process. Thus, a plurality of NAND chip units 100 are formed by the same process. Due to manufacturing variations or the like, non-defective NAND chip units 100-g and defective NAND chip units 100-b may be formed at unspecified positions.

Where a plurality of NAND chip units 100 are individually separated and used in units of one chip, the defective NAND chip units 100-b can be sorted out and excluded. However, the storage wafer 10 according to the first embodiment is used in units of one wafer, so that the defective NAND chip units 100-b cannot be excluded from the non-defective NAND chip units 100-g. Therefore, the number of non-defective NAND chip units 100 that can be used as memories in practice may undesirably decrease with respect to the total number of NAND chip units 100 formed on the same wafer.

According to the first embodiment, the defective NAND chip units 100-b, which are included among the plurality of NAND chip units 100 formed on the semiconductor substrate 71W, are overlaid with non-defective NAND chip units 100'-g, which are included among the NAND chip units 100' formed on the other semiconductor substrate 74W. Thus, as shown in the right portion of FIG. 15, the non-defective NAND chip units 100' can be accessed by the probe electrode 21, instead of the defective NAND chip units 100. It is therefore possible to suppress a decrease in the manufacturing yield of the storage wafers 10 in a pseudo manner. Accordingly, the percentage of non-defective chips on the wafer can be increased.

2. Second Embodiment

Next, a description will be given of a storage system according to a second embodiment.

In connection with the first embodiment, reference was made to the case where a NAND chip unit 100' is mounted on the upper surface of a defective NAND chip unit 100. The second embodiment differs from the first embodiment in that the NAND chip unit 100' is mounted on the upper surface of a region from which the defective NAND chip unit 100 has been removed. In the description below, the configurations and manufacturing method similar to those of the first embodiment will not be mentioned, and mainly the configurations and manufacturing method different from those of the first embodiment will be mentioned.

2.1 Configuration of Storage Wafer

FIG. 16 is a cross-sectional view for illustrating a configuration of a storage wafer according to the second embodiment, and corresponds to FIG. 5 of the first embodiment.

As shown in FIG. 16, a semiconductor substrate 71W includes a first region and a second region different from the first region. The top surface of the second region is lower than the top surface of the first region, as viewed along the Z direction. An element layer 72W is provided on the upper surface of the first region of the semiconductor substrate 71W. A plurality of NAND chip units 100 are formed in the first region of the semiconductor substrate 71W and the element layer 72W (in FIG. 16, only one of the plurality of NAND chip units 100 is shown). A plurality of pad electrodes 11a are formed on the upper surface of each of the plurality of NAND chip units 100.

A structure in which an adhesive film 73, a semiconductor layer 74 and an element layer 75 are stacked in this order is provided on the upper surface of the second region of the semiconductor substrate 71W. The adhesive film 73 has a function of integrally bonding the upper surface of the second region of the semiconductor substrate 71W to the semiconductor layer 74. Although the adhesive film 73 is shown as an insulator in FIG. 16, it does not necessarily have to be non-conductive.

A NAND chip unit 100' is formed in the semiconductor layer 74 and the element layer 75. A plurality of pad electrodes 11b are formed on the upper surface of the element layer 75. The configurations of the semiconductor layer 74, the element layer 75 and the pad electrodes 11*b* are similar to those of the semiconductor layer 74, the element layer 75 and the pad electrodes 11*b* shown in FIG. 5.

Desirably, the difference between the Z-direction height of the pad electrode 11*a* on the upper surface of the element layer 72W and the Z-direction height of the pad electrode 11*b* on the upper surface of the element layer 75 should be as small as possible, and more desirably, that difference should be "0" (that is, the pad electrodes 11*a* and 11*b* should be formed in the same plane).

2.2 Manufacturing Method of Storage Wafer

Next, a description will be given of a method for manufacturing a storage wafer according to the second embodiment.

FIG. 17 is a flowchart illustrating the storage wafer manufacturing method according to the second embodiment, and corresponds to FIG. 10 of the first embodiment. In FIG. 17, step ST25 is added between steps ST20 and ST30 of FIG. 10, and step ST40A is performed instead of step ST40.

As shown in FIG. 17, steps ST10 and ST20 are similar to those shown in FIG. 10, so that a description thereof will be omitted.

In step ST25, defective NAND chip units 100 included among the plurality of NAND chip units 100 formed on the first wafer are selectively removed from the first wafer, for example, by laser irradiation. Thus, those portions of the region (second region) in which defective NAND chip units 100 of the first wafer are formed and which correspond to the plurality of pad electrodes 11*a*, the element layer 72W and the semiconductor substrate 71 are removed. Therefore, the upper surface of the second region of the first wafer is lower than that of the upper surface of the first region.

In step ST30, the second wafer is diced to individually separate a plurality of NAND chip units 100'. Of the plurality of NAND chip units 100' individually separated from each other, the NAND chip units 100' determined to be non-defective in step ST20 are extracted and used in the subsequent step.

In step ST40A, non-defective NAND chip units 100' diced from the second wafer are mounted on the upper surface of the second region of the first wafer.

In this manner, the manufacture of the storage wafer 10 is completed.

2.3 Advantageous Effects of Present Embodiment

According to the second embodiment, defective NAND chip units 100 included among the plurality of NAND chip units 100 formed on the semiconductor substrate 71W are selectively removed from the semiconductor substrate 71W. Non-defective NAND chip units 100' diced from the semiconductor substrate 74W are mounted on the upper surface of the second region of the semiconductor substrate 71W from which the defective NAND chip units 100 are selectively removed. Thus, the NAND chip units 100 that are not accessed by the probe electrodes 21 coupled to the probe card 20 are removed, and the heights of the plurality of NAND chip units 100 and 100' on the storage wafer 10 can be aligned along the Z direction. Therefore, during the probing process with the probe card 20, it is possible to avoid the case where the distance from the probe electrodes 21 differs between the NAND chip units 100 and the NAND chip units 100', and the load imposed on the probe card 20 can be reduced in the probing process.

3. Third Embodiment

Next, a description will be given of a storage system according to a third embodiment.

The third embodiment differs from the first and second embodiments in that a non-defective chip unit having a function different from that of a NAND chip unit is mounted on the upper surface of a defective NAND chip unit 100. In the description below, the configurations and manufacturing method similar to those of the first embodiment will not be mentioned, and mainly the configurations and manufacturing method different from those of the first embodiment will be mentioned.

3.1 Configuration of Storage Wafer

FIG. 18 is a top view for illustrating a configuration of a storage wafer according to the third embodiment, and corresponds to FIG. 4 of the first embodiment.

As shown in FIG. 18, the storage wafer 10 includes a plurality of NAND chip units 100 and at least one chip unit 100". The NAND chip units 100 and the chip unit 100" have different configurations and functions.

Specifically, for example, the chip unit 100" is a memory device other than such a NAND flash memory as a DRAM or an SRAM, and is configured such that it can be controlled based on a control signal from the NAND controller chip 200, just like the NAND chip unit 100. For example, the chip unit 100" may be a NAND controller chip 200 that controls the NAND chip unit 100 by means of the probe card 20. In addition, the chip unit 100" may include any type of circuit that can complement the function of a NAND flash memory and that can be used to control the storage system 1, such as an FPGA, a PCIe switch, a relay circuit, an arithmetic circuit, an error check and correction circuit and a capacitor.

A plurality of NAND chip units 100 are arranged in a matrix on the upper surface of the storage wafer 10 when they are viewed in plan view. One chip unit 100" is provided on the upper surface of the NAND chip unit 100 which is included among the plurality of NAND chip units 100 arranged in a matrix and which is located at a predetermined position. The NAND chip unit 100 formed at the predetermined position where the chip unit 100" is provided is determined in advance, regardless of whether it is non-defective or defective. Therefore, the number of chip units 100" provided on the storage wafer 10 and the positions thereof do not change depending on the storage wafer 10. Thus, the chip unit 100" is electrically insulated from the other NAND chip units 100 on the storage wafer 10, but the use of the probe card 20 enables access to a plurality of NAND chip units 100 even if they are in a predetermined region R including the predetermined position.

3.2 Manufacturing Method of Storage Wafer

Next, a description will be given of a method for manufacturing a storage wafer according to the third embodiment.

FIG. 19 is a flowchart illustrating the storage wafer manufacturing method according to the third embodiment, and corresponds to FIG. 10 of the first embodiment. FIG. 19 includes steps ST10B and ST40B in place of steps ST10 and ST40 shown in FIG. 10.

As shown in FIG. 19, in step ST10B, a plurality of first chip units are formed on a first wafer, and second chip units different from the first chip units are formed on a second wafer. Specifically, a plurality of NAND chip units 100 are formed on the first wafer, and a plurality of chip units 100'' are formed on the second wafer.

In step ST20, defective chip units are detected from each of the first and second wafers, for example, by performing probing or the like on each of the plurality of formed chip units.

In step ST30, the second wafer is diced to individually separate the plurality of chip units 100''. Of the plurality of chip units 100'' individually separated from each other, the chip units 100'' determined to be non-defective in step ST20 are extracted and used in the subsequent step.

In step ST40B, non-defective chip units 100'' diced from the second wafer are mounted on the upper surfaces of NAND chip units 100 which are included among the plurality of chip units 100 formed on the first wafer and which are located at predetermined positions.

In this manner, the manufacture of the storage wafer 10 is completed.

3.3 Advantageous Effects of Present Embodiment

According to the third embodiment, a chip unit 100'' having a function different from that of the NAND chip unit 100 is mounted on the upper surface of the NAND chip unit 100 formed on the semiconductor substrate 71W. Thus, the chip unit 100'', which has a function that the NAND chip unit 100 does not have, can be accessed by the NAND chip unit 100 by means of the probe card 20. Therefore, the control load imposed on the NAND chip units 100 in the storage wafer 10 can be reduced.

The chip unit 100'' is mounted on the upper surface of a NAND chip unit 100 which is included among the plurality of NAND chip units 100 and is formed at a predetermined position. Thus, even if the storage wafer 10 is replaced with another storage wafer 10 in the wafer stocker 5, the NAND chip unit 100 can be provided with the function of the chip unit 100'', with no need to change the arrangement and configurations of the probe card 20 and the probe electrodes 21.

In connection with the above example, reference was made to the case where the chip unit 100'' is mounted on the upper surface of the NAND chip unit 100, as in the first embodiment, but this is not restrictive. For example, as in the second embodiment, the chip unit 100'' can be mounted on the region from which the NAND chip unit 100 has been removed, and even in this case, the same advantageous effects as described above can be obtained.

4. Fourth Embodiment

Next, a description will be given of a storage system according to a fourth embodiment.

In connection with the first to third embodiments, reference was made to the case where chip units are mounted on the upper surfaces of partial regions of the semiconductor substrate 71W on which a plurality of NAND chip units 100 are formed. The fourth embodiment differs from the first to third embodiments in that all chip units included in the storage wafer 10 are mounted on the top surfaces of different regions of the same support. In the description below, the configurations and manufacturing method similar to those of the first embodiment will not be mentioned, and mainly the configurations and manufacturing method different from those of the first embodiment will be mentioned.

4.1 Configuration of Storage Wafer

FIG. 20 is a cross-sectional view for illustrating a configuration of the storage wafer according to the fourth embodiment, and corresponds to FIG. 5 of the first embodiment.

As shown in FIG. 20, the storage wafer 10 includes a support 81W, a plurality of adhesive films 70 and 73, a plurality of semiconductor layers 71 and 74, and a plurality of element layers 72 and 75.

The support 81W is a substrate for supporting a plurality of NAND chip units 100, and any kind of supports, such as silicon wafers, glass substrates and ring tapes, are applicable. The support 81W need not have a disk shape and may have a rectangular shape.

A plurality of first structures and a plurality of second structures are provided on the upper surfaces of a plurality of regions of the support 81W that are different from each other (in FIG. 20, one first structure and one second structure are shown).

Each of the plurality of first structures includes an adhesive film 70, a semiconductor layer 71 and an element layer 72, which are stacked in this order. Each of the plurality of second structures includes an adhesive film 73, a semiconductor layer 74 and an element layer 75, which are stacked in this order.

The adhesive films 70 and 73 are provided separately from each other. Although each of the plurality of adhesive films 70 and 73 is shown as an insulator in FIG. 20, it does not necessarily have to be non-conductive.

A NAND chip unit 100 is formed in the semiconductor layer 71 and the element layer 72. A NAND chip unit 100' is formed in the semiconductor layer 74 and the element layer 75. The configurations of the NAND chip units 100 and 100' are similar to those of the NAND chip units 100 and 100' shown in FIG. 5.

A plurality of pad electrodes 11a are formed on the upper surface of each of the plurality of element layers 72. A plurality of pad electrodes 11b are formed on the upper surface of each of the plurality of element layers 75. It is desirable that the plurality of pad electrodes 11a and 11b formed above the support 81W have approximately the same height along the Z direction.

4.2 Manufacturing Method of Storage Wafer

Next, a description will be given of a method for manufacturing a storage wafer according to the fourth embodiment.

FIG. 21 is a flowchart illustrating the storage wafer manufacturing method according to the fourth embodiment, and corresponds to FIG. 10 of the first embodiment. FIG. 21 includes steps ST30C and ST40C in place of steps ST30 and ST40 shown in FIG. 10.

As shown in FIG. 21, steps ST10 and ST20 are similar to those shown in FIG. 10, so that a description thereof will be omitted.

In step ST30C, a dicing process is performed for each of the first wafer and the second wafer to individually separate a plurality of NAND chip units 100 and 100'. Of the plurality of NAND chip units 100 and 100' individually separated from each other, the NAND chip units 100 and 100' determined to be non-defective in step ST20 are extracted and used in the subsequent step.

In step ST40C, the non-defective NAND chip units 100 and 100' diced from the first and second wafers, respectively, are mounted on the upper surfaces of different regions of the support 81W.

In this manner, the manufacture of the storage wafer 10 is completed.

4.3 Advantageous Effects of Present Embodiment

According to the fourth embodiment, a plurality of NAND chip units 100 are mounted on the same support 81W, with different adhesive films 70 interposed. Also, a plurality of NAND chip units 100' are mounted on the same support 81W, with different adhesive films 73 interposed. Thus, a predetermined number of NAND chip units mounted on the support 81W can be freely selected from a plurality of NAND chip units 100 and 100' manufactured from a plurality of wafers. For this reason, for example, only NAND chip units 100 and 100' having a particularly large memory capacity (for example, having a small number of bad blocks) can be selected from among the non-defective NAND chip units 100 and 100', and the storage wafer 10 can be manufactured using the selected NAND chip units.

In connection with the above example, reference was made to the case where the NAND chip unit 100 and the NAND chip unit 100' are mounted on the same support 81W as in the first embodiment, but this is not restrictive. For example, a NAND chip unit 100 and a chip unit 100'' having different functions may be mounted on the same support 81W, as in the third embodiment. With this configuration, the chip unit 100'' need not be replaced with a non-defective NAND chip unit 100, so that the space on the wafer can be used more efficiently.

5. Modifications, Etc

The first to fourth embodiments described above are not limited to the examples described above, and various modifications can be made.

5.1 First Modification

For example, in connection with the first to fourth embodiments described above, reference was made to the case where the probe electrodes 21 are brought into direct contact with the plurality of pad electrodes 11a and the plurality of pad electrodes 11b, but this is not restrictive. For example, the plurality of pad electrodes 11a and the plurality of pad electrodes 11b may be rearranged on the storage wafer 10 by providing rewirings. The probe electrodes 21 may be configured such that they can be brought into contact with rearranged pads. In the description below, the configurations and manufacturing method similar to those of the first embodiment will not be mentioned, and mainly the configurations and manufacturing method different from those of the first embodiment will be mentioned.

FIG. 22 is a cross-sectional view for illustrating the configuration of a storage wafer according to a first modification.

As shown in FIG. 22, for example, an insulating layer 82W is provided on the upper surfaces of element layers 72W and 75. The insulating layer 82W contains, for example, polyimide, and is provided such that the upper surface of the insulating layer 82W above the NAND chip unit 100 and the upper surface of the insulating layer 82W above the NAND chip unit 100' are aligned.

A plurality of contacts 83 are provided in the insulating layer 82W, each extending along the Z direction and in contact with the upper surface of the corresponding pad electrode 11a. A conductive layer 84 is provided on the upper surface of each of the plurality of contacts 83. The conductive layer 84 extends, for example, along the Y direction and functions as a rewiring layer. A pad electrode 11ar exposed upward in the insulating layer 82W is provided on the upper surface of each of a plurality of conductive layers 84.

Likewise, a plurality of contacts 85, each extending along the Z direction and in contact with the upper surface of the corresponding pad electrode 11b, are provided in the insulating layer 82W. A conductive layer 86 is provided on the upper surface of each of the plurality of contacts 85. The conductive layer 86 extends, for example, along the Y direction and functions as a rewiring layer. A pad electrode 11br exposed upward in the insulating layer 82W is provided on the upper surface of each of the plurality of conductive layers 86.

The pad electrodes 11ar and 11br are pads obtained by rearranging the corresponding pad electrodes 11a and 11b on the storage wafer 10, respectively. In the example shown in FIG. 22, one pad electrode 11ar and one pad electrode 11br are illustrated for convenience of description.

With the above configuration, the positions of the pad electrodes 11ar and 11br as viewed from the side of the probe card 20 can be rearranged to freely designed positions without reference to the positions of the NAND chip units 100 and 100' on the storage wafer 10.

In addition, the upper surface of the insulating layer 82W is made uniform entirely, so that the distances between the rearranged pad electrodes 11ar and 11br and the probe electrodes 21 can be made uniform. Thus, the load of the probing process can be reduced.

5.2 Second Modification

In connection with the first modification described above, reference was made to the case where an individual pad electrode 11ar is rearranged for each of the plurality of pad electrodes 11a, and an individual pad electrode 11br is rearranged for each of the plurality of pad electrodes 11b. However, this is not restrictive. For example, the rearranged pads may be shared by a plurality of NAND chip units. In the description below, the configurations and manufacturing method similar to those of the first modification will not be mentioned, and mainly the configurations and manufacturing method different from those of the first modification will be mentioned.

Figure 23:
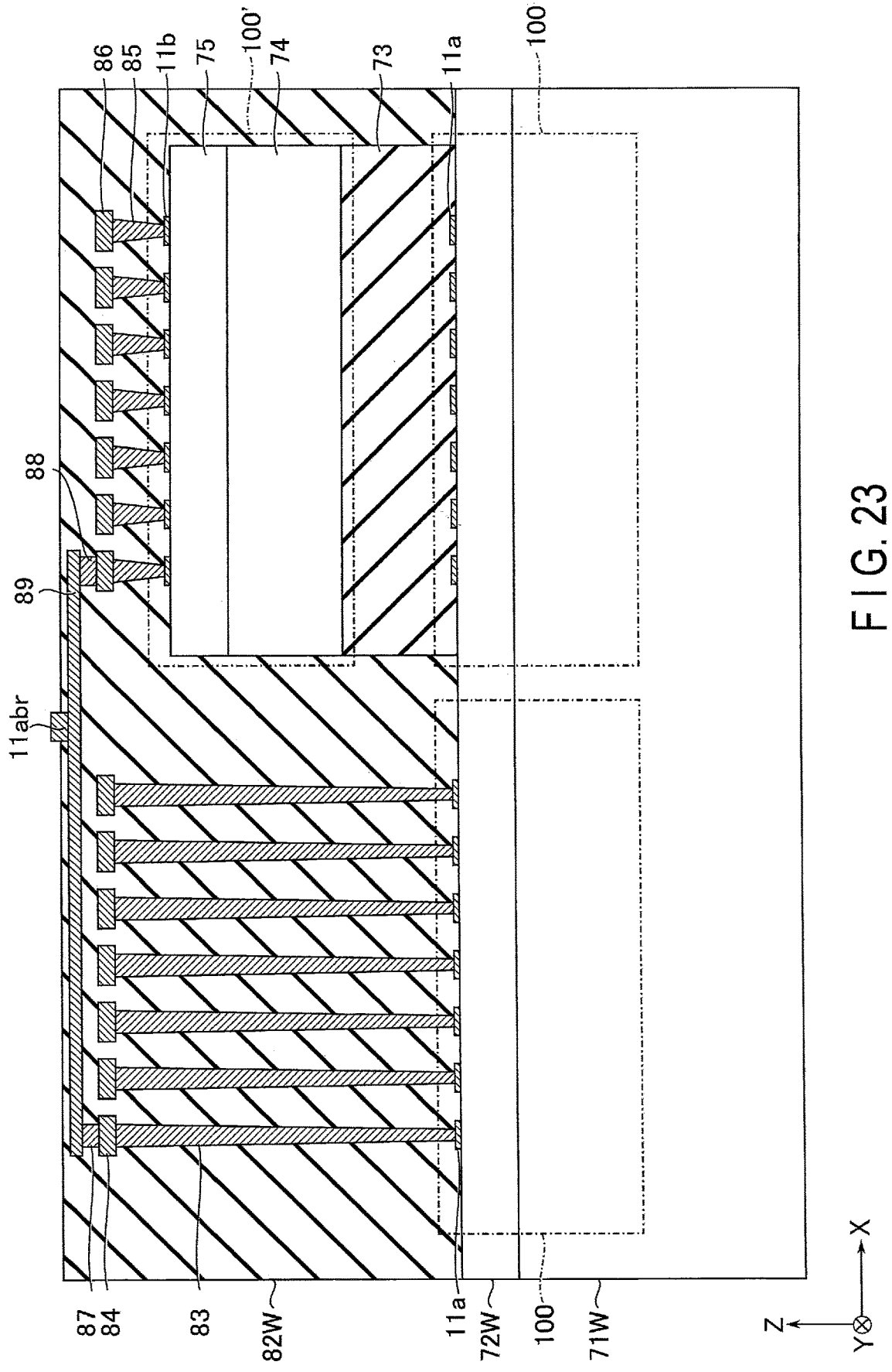
FIG. 23 is a cross-sectional view for illustrating a configuration of a storage wafer according to a second modification.

FIG. 23 is a cross-sectional view for illustrating a configuration of the storage wafer according to a second modification, and corresponds to FIG. 22 of the first modification.

As shown in FIG. 23, a contact 87 extending along the Z direction is provided on the upper surface of each of a plurality of conductive layers 84. In addition, a contact 88 extending along the Z direction is provided on the upper surface of each of a plurality of conductive layers 86.

A conductive layer 89 is provided such that it is in contact with the upper surfaces of the corresponding contacts 87 and 88. The conductive layer 89 extends, for example, along the X direction and functions as a second rewiring layer. A pad electrode 11abr exposed upward in an insulating layer 82W is provided on the upper surface of the conductive layer 89.

With the configuration as described above, the pad electrode 11abr can be shared between the plurality of NAND chip units 100 and 100'. This can reduce the number of pads required when a common signal or common power supply voltage is used between the plurality of NAND chip units 100 and 100'. Therefore, the number of probe electrodes 21 can be reduced, and the load of the probing process can be reduced.

5.3 Third Modification

In connection with the first to fourth embodiments and the first and second modifications described above, reference was made to the case where chip units are mounted during the manufacture of the storage wafer, but the timing of mounting chip units is not limited to the timing during the manufacture of the storage wafer. For example, a chip unit may be mounted again (remounted) where a non-defective chip unit becomes defective as a result of repeated use of the storage wafer. In the description below, reference will be made to the case where a remount process is performed for the storage wafer according to the first embodiment.

Figure 24:
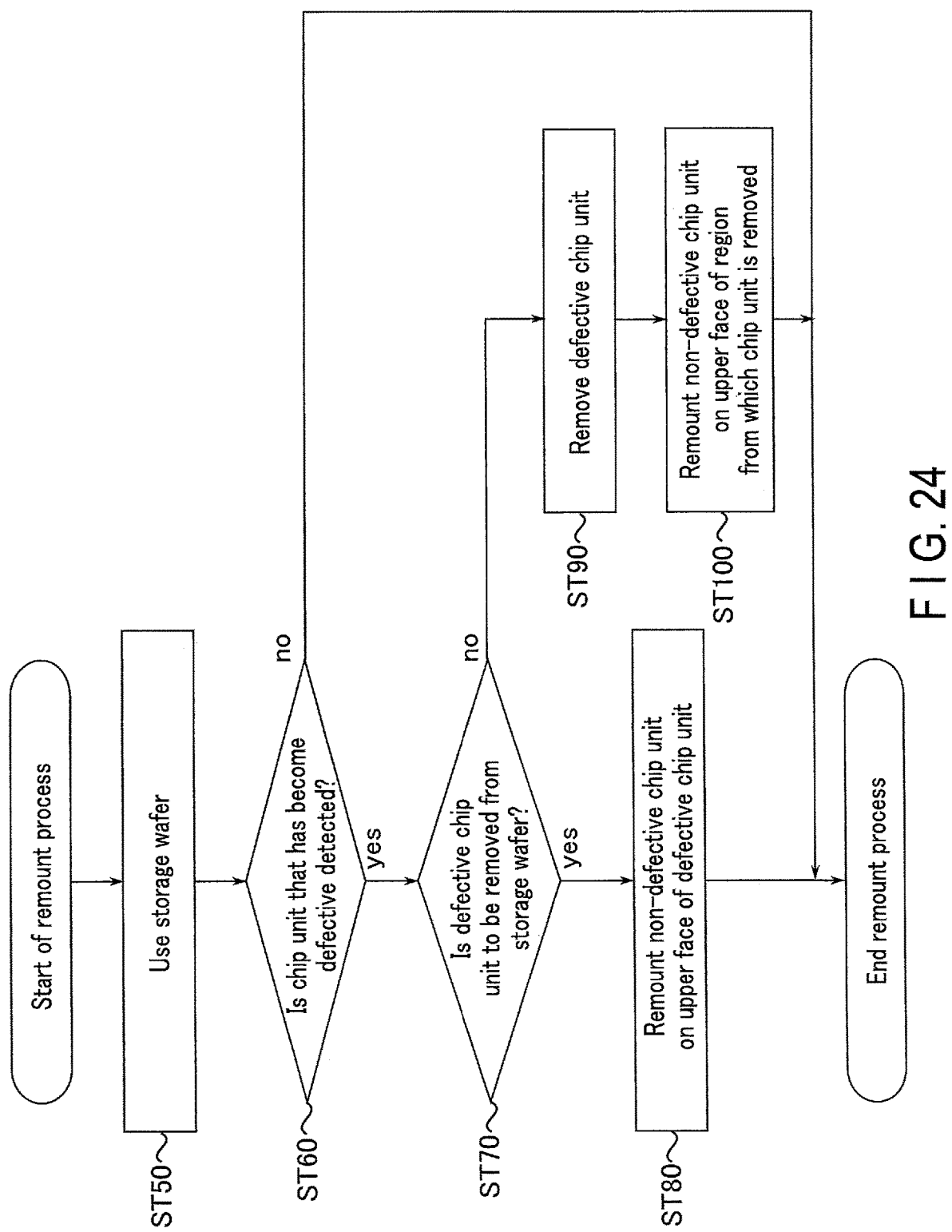
FIG. 24 is a flowchart for illustrating a remount process performed for a storage wafer according to a third modification.

FIG. 24 is a flowchart for illustrating how a remount process is performed for a storage wafer according to a third modification.

As shown in FIG. 24, in step ST50, for example, a storage wafer 10 manufactured by the manufacturing method shown in FIG. 10 is used. The storage wafer 10 deteriorates due to continued use, and non-defective NAND chip unit 100 or 100' may become defective.

In step ST60, a probing process or the like is executed to determine whether a NAND chip unit 100 or 100' that has become defective is included in the NAND chip units 100 formed on the storage wafer 10 and the NAND chip units 100' mounted on the storage wafer. Where the NAND chip unit 100 or 100' that has become defective is detected (step ST60; yes), the process proceeds to step ST70. Where the NAND chip unit 100 or 100' that has become defective is not detected (step ST60; no), the remount process ends.

In step ST70, it is determined whether or not to remove the defective NAND chip unit 100 or 100' from the storage wafer 10.

Where the defective NAND chip unit 100 or 100' is removed from the storage wafer 10 (step ST70; yes), the process proceeds to step ST80. In step ST80, a non-defective NAND chip unit 100' is remounted on the upper surface of the defective NAND chip unit 100 or 100'.

On the other hand, where the defective NAND chip unit 100 or 100' is not removed from the storage wafer 10 (step ST70; no), the process proceeds to step ST90. In step ST90, the NAND chip unit 100 or 100' that has become defective is selectively removed, for example, by laser irradiation. Where, like the NAND chip unit 100', the defective NAND chip unit is adhered by means of an adhesive film 73, it need not be etched by laser irradiation but may be physically removed.

In step ST100, a non-defective NAND chip unit 100' is remounted on the upper surface of the region from which the NAND chip unit 100 or 100' has been removed.

By the operation described above, all the NAND chip units 100 and 100 on the storage wafer 10 can be processed as non-defective chip units by the probe card 20, regardless of whether or not the defective NAND chip unit 100 or 100' is removed. Thus, even if the NAND chip unit 100 or 100' deteriorates as a result of the repeated use of the storage wafer 10, a non-defective NAND chip unit 100' can be remounted, so that the percentage of non-defective chips on the wafer can be kept at a high level.

5.4 Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A storage wafer comprising:
   a first semiconductor;
   a first element layer provided on an upper surface of the first semiconductor;
   a first pad provided on an upper surface of a first region of the first element layer;
   a second pad provided on an upper surface of a second region different from the first region of the first element layer;
   an adhesive film provided on the upper surface of the second region of the first element layer including the second pad;
   a second semiconductor provided on an upper surface of the adhesive film;
   a second element layer provided on an upper surface of the second semiconductor; and
   a third pad provided on an upper surface of the second element layer,
   wherein
   the first element layer includes:
      a first memory chip unit electrically coupled to the first pad; and
      a second memory chip unit electrically coupled to the second pad,
   the second element layer includes an element electrically coupled to the third pad and electrically isolated from both the first pad and the second pad, and
   the second pad is electrically isolated from an external electrode by the adhesive film, the external electrode being provided on an outside of the storage wafer.

2. The storage wafer according to claim 1, wherein the element includes a third memory chip unit.

3. The storage wafer according to claim 2, wherein a memory capacity of the second memory chip unit is smaller than a memory capacity of the first memory chip unit and a memory capacity of the third memory chip unit.

4. The storage wafer according to claim 1, wherein the element has a function different from functions of the first memory chip unit and the second memory chip unit.

5. The storage wafer according to claim 4, wherein a position of the element is independent on a memory capacity of the second memory chip unit.

6. The storage wafer according to claim 1, further comprising:
   an insulating layer provided on upper surfaces of the first element layer and the second element layer;
   a first conductive layer which is in contact with the first pad in the insulating layer;
   a fourth pad including a lower surface which is in contact with an upper surface of the first conductive layer and an upper surface which is not in contact with the insulating layer;
   a second conductive layer which is in contact with the third pad in the insulating layer; and a fifth pad including a lower surface which is in contact with an upper surface of the second conductive layer and an upper surface which is not in contact with the insulating layer.

7. The storage wafer according to claim 1, further comprising:

an insulating layer provided on upper surfaces of the first element layer and the second element layer;

a first conductive layer which is in contact with the first pad in the insulating layer;

a second conductive layer which is in contact with the third pad in the insulating layer;

a third conductive layer which is in contact with the first conductive layer and the second conductive layer; and a sixth pad including a lower surface which is in contact with an upper surface of the third conductive layer and an upper surface which is not in contact with the insulating layer.

8. The storage wafer according to claim 1, wherein a memory chip unit provided in the second region of the first element layer is a memory chip unit determined as being defective.

9. A storage wafer comprising:

a first semiconductor including a first region and a second region whose upper surface is lower than the first region;

a first element layer provided on an upper surface of the first region of the first semiconductor;

a first pad provided on an upper surface of the first element layer;

an adhesive film provided on an upper surface of the second region of the first semiconductor;

a second semiconductor provided on an upper surface of the adhesive film;

a second element layer provided on an upper surface of the second semiconductor; and a second pad provided on an upper surface of the second element layer, wherein the first element layer includes a first memory chip unit electrically coupled to the first pad;

the second element layer includes an element electrically coupled to the second pad and electrically isolated from the first pad, and the first pad and the second pad are provided in substantially a same plane.

10. The storage wafer according to claim 9, wherein the element includes a second memory chip unit.

11. The storage wafer according to claim 9, wherein the element has a function different from that of the first memory chip unit.

12. The storage wafer according to claim 9, further comprising:

an insulating layer provided on upper surfaces of the first element layer and the second element layer;

a first conductive layer which is in contact with the first pad in the insulating layer;

a third pad including a lower surface which is in contact with an upper surface of the first conductive layer and an upper surface which is not in contact with the insulating layer;

a second conductive layer which is in contact with the second pad in the insulating layer; and a fourth pad including a lower surface which is in contact with an upper surface of the second conductive layer and an upper surface which is not in contact with the insulating layer.

13. The storage wafer according to claim 9, further comprising:

an insulating layer provided on upper surfaces of the first element layer and the second element layer;

a first conductive layer which is in contact with the first pad in the insulating layer;

a second conductive layer which is in contact with the second pad in the insulating layer; and a third conductive layer which is in contact with the first conductive layer and the second conductive layer; and a fifth pad including a lower surface which is in contact with an upper surface of the third conductive layer and an upper surface which is not in contact with the insulating layer.

14. A manufacturing method of a storage wafer, comprising:

forming a first plurality of chip units on a first wafer;

forming a second plurality of chip units on a second wafer;

determining whether a condition is satisfied with respect to each of the first plurality of chip units and the second plurality of chip units;

specifying a first chip unit included in the first plurality of chip units and determined as satisfying the condition, a second chip unit included in the first plurality of chip units and determined as failing to satisfy the condition, and a third chip unit included in the second plurality of chip units and determined as satisfying the condition;

dicing the second wafer into each of the second plurality of chip units; and mounting the third chip unit on an upper surface of the second chip unit via a first adhesive film, wherein a first pad provided on the first chip unit and a second pad provided on the second chip unit are provided in substantially a same plane, and the second pad is electrically isolated from an external electrode by the first adhesive film, the external electrode being provided on an outside of the first wafer.

15. The manufacturing method according to claim 14, further comprising:

determining defectiveness with respect to each of the first plurality of chip units which are formed on the first wafer and on which the third chip unit is not mounted;

specifying a fourth chip unit included in the first plurality of chip units and determined as being defective, and a fifth chip unit, different from the third chip unit, included in the second plurality of chip units and determined as satisfying the condition; and remounting the fifth chip unit on an upper surface of the fourth chip unit via a second adhesive film.

16. A manufacturing method of a storage wafer, comprising:

forming a first plurality of chip units on a first wafer;

forming a second plurality of chip units on a second wafer;

determining whether a condition is satisfied with respect to each of the first plurality of chip units and the second plurality of chip units;

specifying a first chip unit included in the first plurality of chip units and determined as satisfying the condition, a second chip unit included in the first plurality of chip units and determined as failing to satisfy the condition, and a third chip unit included in the second plurality of chip units and determined as satisfying the condition;

dicing the second wafer into each of the second plurality of chip units;

removing the second chip unit from the first wafer; and mounting the third chip unit on a first region where the second chip unit has been removed via an adhesive film, wherein a first pad provided on the first chip unit and a third pad provided on the mounted third chip unit are provided in substantially a same plane.

17. The manufacturing method according to claim 16, further comprising:

determining defectiveness with respect to each of the first plurality of chip units which are formed on the first wafer and on which the third chip unit is not mounted;

specifying a fourth chip unit included in the first plurality of chip units and determined as being defective, and a fifth chip unit, different from the third chip unit, included in the second plurality of chip units and determined as satisfying the condition;

removing the fourth chip unit from the first wafer; and remounting the fifth chip unit on a second region where the fourth chip unit has been removed via a second adhesive film.

\* \* \* \* \*